(12) United States Patent
Schwartz et al.

(10) Patent No.: US 11,681,941 B2
(45) Date of Patent: Jun. 20, 2023

(54) SYSTEMS AND METHOD FOR QUANTUM COMPUTING

(71) Applicant: NVISION IMAGING TECHNOLOGIES GMBH, Ulm (DE)

(72) Inventors: Ilai Schwartz, Neu-Ulm (DE); Matthias Pfender, Waiblingen (DE); Tobias Schaub, Ulm (DE); Philipp Neumann, Kernen im Remstal (DE)

(73) Assignee: NVision Imaging Technologies GmbH, Ulm (DE)

( * ) Notice: Subject to any disclaimer, the term of this patent is extended or adjusted under 35 U.S.C. 154(b) by 0 days.

(21) Appl. No.: 17/662,985

(22) Filed: May 11, 2022

(65) Prior Publication Data

US 2023/0026430 A1 Jan. 26, 2023

Related U.S. Application Data

(60) Provisional application No. 63/201,756, filed on May 12, 2021.

(51) Int. Cl.
*G06N 10/40* (2022.01)
*B82Y 10/00* (2011.01)
*H01L 39/22* (2006.01)

(52) U.S. Cl.
CPC ............ *H01L 39/223* (2013.01); *B82Y 10/00* (2013.01); *G06N 10/40* (2022.01)

(58) Field of Classification Search
CPC ...................................................... G06N 10/40
See application file for complete search history.

(56) References Cited

PUBLICATIONS

F Jelezko and J Wrachtrup 2004 J. Phys.: Condens. Matter 16 R1089 (Year: 2004).*
Bayliss et al. (2020) "Optically addressable molecular spins for quantum information processing", Science 370, 1309-1312.
Miao et al. (2020) "Universal coherence protection in a solid-state spin qubit", Science 369, 1493-1497.

* cited by examiner

*Primary Examiner* — Matthew L Reames
(74) *Attorney, Agent, or Firm* — Finnegan, Henderson, Farabow, Garrett & Dunner, LLP

(57) ABSTRACT

The present disclosure describes non-classical (e.g., quantum) computing systems and methods that utilize dopant molecules contained in host materials as qubits.

30 Claims, 4 Drawing Sheets

400

Obtain a plurality of dopant molecules contained in at least one host material, wherein each dopant molecule is associated with an electronic energy level structure that includes a triplet electronic manifold, wherein the triplet electronic manifold comprises a first triplet state, a second triplet state, and a third triplet state
410

Configure each dopant molecule as a qubit having at least a first qubit state and a second qubit state, wherein the first qubit state comprises a first linear combination of the first triplet state, the second triplet state, and the third triplet state, wherein the second qubit state comprising a second linear combination of the first triplet state, the second triplet state, and the third triplet state, wherein the first qubit state is different from the second qubit state
420

Perform a non-classical computation on the at least one dopant molecule
430

FIG. 4

SYSTEMS AND METHOD FOR QUANTUM COMPUTING

CROSS-REFERENCES TO RELATED APPLICATIONS

This application claims priority to U.S. Provisional Patent Application No. 63/201,756, filed on May 12, 2021, entitled "Solid Spin Quantum Computers," which is incorporated herein by reference in its entirety for all purposes.

TECHNICAL FIELD

The disclosed embodiments generally relate to non-classical (e.g., quantum) computing systems and methods that utilize dopant molecules contained in host materials as qubits.

BACKGROUND

Non-classical computers (e.g., quantum computers) typically exploit quantum mechanical phenomena, such as superposition, entanglement, and interference, to perform computational operations on data. In comparison to classical computers, which utilize binary digits (bits) that always have a defined state (0 or 1), non-classical computers utilize quantum bits (qubits) that can exist in a superposition of basis states (i.e., some linear combination of basis state |0> and basis state |1>, where basis states |0> and |1> are orthonormal). Various qubits of the non-classical computer may be entangled with other qubits (i.e., the quantum states of two or more qubits may be correlated such that operations on one qubit affect the state of an entangled qubit). Quantum operations may be performed to direct the states of the qubits to probabilistically converge on a particular final state, which represents the solution to some problem. For certain classes of problems, the non-classical computer may converge to the solution faster than is possible using any known algorithm on a classical computer. In some cases, this "quantum advantage" may allow the non-classical computer to solve problems that would be intractable using any known classical computer. Such problems include the factoring of large relatively prime numbers (e.g., for breaking modern cryptographic hash functions), searching for particular items in large quantities of data, and simulating the chemical behavior of drugs, materials, or other molecules.

SUMMARY

In some embodiments, the present disclosure describes non-classical (e.g., quantum) computing systems and methods that utilize dopant molecules contained in host materials as qubits.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which comprise a part of this specification, illustrate several embodiments and, together with the description, serve to explain certain principles and features of the disclosed embodiments. In the drawings:

FIG. 4 shows a flowchart depicting a method for performing a non-classical computation, in accordance with various embodiments.

DETAILED DESCRIPTION

Figure 1A:
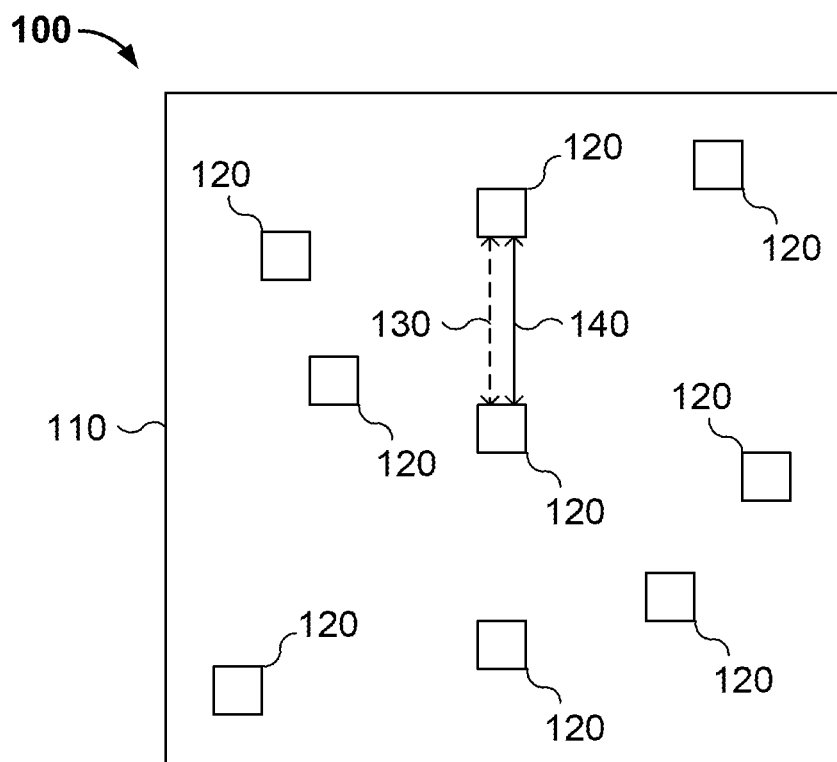
FIG. 1A shows a top view of a system for performing a non-classical computation, in accordance with various embodiments.

Reference will now be made in detail to exemplary embodiments, discussed with regards to the accompanying drawings. Unless otherwise defined, technical and/or scientific terms have the meaning commonly understood by one of ordinary skill in the art. The disclosed embodiments are described in sufficient detail to enable those skilled in the art to practice the disclosed embodiments. It is to be understood that other embodiments may be utilized and that changes may be made without departing from the scope of the disclosed embodiments. Thus, the materials, methods, and examples are illustrative only and are not intended to be necessarily limiting.

As used herein, the term "or" shall convey both disjunctive and conjunctive meanings. For instance, the phrase "A or B" shall be interpreted to include element A alone, element B alone, and the combination of elements A and B.

In the Figures (also, "FIGs." or "Figs."), like numbers refer to like elements.

Non-classical computers (e.g., quantum computers) typically exploit quantum mechanical phenomena, such as superposition, entanglement, and interference, to perform computational operations on data. In comparison to classical computers, which utilize binary digits (bits) that always have a defined state (0 or 1), non-classical computers utilize quantum bits (qubits) that can exist in a superposition of basis states (i.e., some linear combination of basis state |0> and basis state |1>). Various qubits of the non-classical computer may be entangled with other qubits (i.e., the quantum states of two or more qubits may be correlated such that operations on one qubit affect the state of an entangled qubit). Quantum operations may be performed to direct the states of the qubits to probabilistically converge on a solution to some problem. For certain classes of problems, the non-classical computer may converge to the solution faster than is possible using any known algorithm on a classical computer. In some cases, this "quantum advantage" may allow the non-classical computer to solve problems that would be intractable using any known classical computer. Such problems include the factoring of large relatively prime numbers (e.g., for breaking modern cryptographic hash functions), searching for particular items in large quantities of data, and simulating the chemical behavior of drugs, materials, or other molecules.

Numerous chemical and physical systems have been proposed for use as qubits in non-classical computers. For instance, significant resources have been directed to superconducting qubits utilizing Josephson junctions (i.e., a superconductor-insulator-superconductor transition). Such superconducting qubits utilize the different quantum tunneling modes through the Josephson junction as basis states. These superconducting qubits can be manufactured using well-known semiconductor fabrication techniques, permitting relatively straightforward circuit design. However, superconducting qubits suffer from a number of disadvantages. For instance, the superconducting qubits must generally be cooled to a fraction of a degree above absolute zero, necessitating a complicated cryogenic system. The use of such complicated cryogenics also makes it difficult to entangle more than a few qubits and limits the ultimate computational power of a superconducting qubit-based non-classical computer.

Numerous other systems have been used as qubits, including arrays of trapped ions, arrays of trapped neutral atoms, and chemical defects in solid-state lattices. One system proposed for use in quantum computing is the so-called nitrogen vacancy (NV) center in diamonds. An electron spin associated with an NV center can be optically initialized and its spin state can be read out by fluorescence detection. In addition, the electron spin can be manipulated by microwave (MW) or radio-frequency (RF) irradiation, and can exhibit a relatively long relaxation and coherence time. However, existing NV quantum computers can only support a limited number of qubits before deleterious effects associated with increasing the number of qubits leads to a decrease in the relaxation and coherence times, negating the very properties that make NV quantum computers attractive in the first place. This is due to the fact that the natural abundance of carbon-13 ($^{13}C$) spins in diamond is 1.1%. Increasing the isotopic concentration of $^{13}C$ spins in the diamond leads to worse NV center properties due to an increase in the number of nearby $^{13}C$ spin. Moreover, the random distribution of the $^{13}C$ spins will lead to couplings on a very wide scale, with some $^{13}C$ spins very strongly coupled to the NV centers (e.g. for the case of neighboring $^{13}C$ spins). This can make the NV centers hard to manipulate and control. In addition, as every NV center has a different associated $^{13}C$ spin bath due to the random distribution of the $^{13}C$ spins, NV qubits work almost exclusively with single NV spins, leading to low signal to noise (SNR) and requiring non-classical computations to be performed multiple times to achieve a measurable signal. Moreover, it may be difficult to prepare diamonds that are controllably doped with NV centers, as it can be difficult to prepare highly crystalline diamonds with controlled NV doping rates.

Thus, there is a need for qubits based on chemical or physical systems that avoid the problems associated with known qubits. Ideally, such chemical or physical systems should be relatively simple to manufacture, support hundreds or thousands of qubits on a single device, allow each qubit to be manipulated independently from every other qubit, and have a coherence lifetime that is substantially longer than the time required to perform quantum operations on each qubit. Systems consistent with disclosed embodiments can meet some or all of these criteria and therefore provide technical improvements in performing non-classical computations.

As used herein, the terms "non-classical computation," "non-classical procedure," "non-classical operation," and "non-classical computer" generally refer to any system or method for performing computational procedures outside of the paradigm of classical computing. A non-classical computation, non-classic procedure, non-classical operation, or non-classical computer may comprise a quantum computation, quantum procedure, quantum operation, or quantum computer.

As used herein, the terms "quantum computation," "quantum procedure," "quantum operation," and "quantum computer" generally refer to any method or system for performing computations using quantum mechanical operations (such as unitary transformations or completely positive trace-preserving (CPTP) maps on quantum channels) on a Hilbert space represented by a quantum device. As such, quantum and classical (or digital) computation may be similar in the following aspect: both computations may comprise sequences of instructions performed on input information to then provide an output. Various paradigms of quantum computation may break the quantum operations down into sequences of basic quantum operations that affect a subset of qubits of the quantum device simultaneously. The quantum operations may be selected based on, for instance, their locality or their ease of physical implementation. A quantum procedure or computation may then consist of a sequence of such instructions that in various applications may represent different quantum evolutions on the quantum device. For example, procedures to compute or simulate quantum chemistry may represent the quantum states and the annihilation and creation operators of electron spin orbitals by using qubits (such as two-level quantum systems) and a universal quantum gate set (such as the Hadamard, controlled-not (CNOT), and π/8 rotation) through the so-called Jordan-Wigner transformation or Bravyi-Kitaev transformation.

Additional examples of quantum procedures or computations may include procedures for optimization such as quantum approximate optimization algorithm (QAOA) or quantum minimum finding. QAOA may comprise performing rotations of single qubits and entangling gates of multiple qubits. In quantum adiabatic computation, the instructions may carry stochastic or non-stochastic paths of evolution of an initial quantum system to a final one. Quantum-inspired procedures may include simulated annealing, parallel tempering, master equation solver, Monte Carlo procedures, quantum algorithms for approximating maximum independent sets, and the like. Quantum-classical or hybrid algorithms or procedures may comprise such procedures as variational quantum eigensolver (VQE) and the variational and adiabatically navigated quantum eigensolver (VanQver).

In general, examples of quantum procedures or computations may include any procedures or computations described in M. A. Nielsen and I. L. Chuang, Quantum Computation and Quantum Information, Cambridge University Press (2013), which is incorporated herein by reference in its entirety for all purposes.

A quantum computer may comprise one or more adiabatic quantum computers, quantum gate arrays, one-way quantum computers, topological quantum computers, quantum Turing machines, quantum annealers, Ising solvers, or gate models of quantum computing.

Doped Host Materials as Qubits for Performing Non-Classical Computations

Provided herein are systems and methods for performing non-classical computations. The systems and methods generally utilize dopant molecules contained in organic host materials. The dopant molecules generally function as qubits and are associated with electronic energy level structures that include a triplet electronic manifold. The triplet electronic manifold may comprise a ground state triplet (GST) electronic manifold or an excited state triplet (EST) electronic manifold. The triplet electronic manifold generally comprises three triplet states, which can be linearly combined to form qubit basis states (e.g., with respect to a laboratory frame of reference, a rotating frame of reference, or another suitable time-independent or time-dependent frame of reference). The basis states generally have long lifetimes at the temperatures obtainable using liquid helium-based cryogenic systems. The dopant molecules may be arranged in the host material to permit relatively strong couplings between nearest neighbor dopant molecules, allowing the proliferation of information across the qubit network through entanglement. The quantum states of the various dopant molecules may be individually manipulated using optical, MW, or RF techniques, allowing individual control of each qubit to perform the non-classical computation.

FIG. 1A shows a top view of a system 100 for performing a non-classical computation, in accordance with various embodiments. In the example shown, the system 100 comprises at least one host material 110. In some embodiments, the host material 110 comprises at least one organic molecule.

In some embodiments, the host material 110 comprises a crystalline host material. In some embodiments, the host material 110 comprises a single crystalline host material. In some embodiments, the host material 110 comprises a polycrystalline host material. In some embodiments, the host material 110 comprises a liquid crystalline host material. In some embodiments, the host material 110 comprises an amorphous host material. In some embodiments, the host material 110 comprises a powder host material. In some embodiments, the host material 110 comprises a frozen solution host material. In some embodiments, the frozen solution host material comprises a solution that is frozen at cryogenic temperatures. For instance, in some embodiments, the frozen solution host material is frozen at a temperature of at least about 1 Kelvin (K), 2 K, 3 K, 4 K, 5 K, 6 K, 7 K, 8 K, 9 K, 10K, 15 K, 20 K, 25 K, 30 K, 35 K, 40 K, 45 K, 50 K, or more, at most about 50 K, 45 K, 40 K, 35 K, 30 K, 25 K, 20 K, 15K, 10 K, 9 K, 8 K, 7 K, 6 K, 5 K, 4 K, 3 K, 2 K, 1K, or less, or a temperature that is between any two of the preceding values.

In some embodiments, the host material 110 comprises a linear or branched alkane. In some embodiments, the linear or branched alkane comprises a C4-C20 linear or branched alkane. In some embodiments, the linear or branched alkane comprises a C4 linear or branched alkane, a C5 linear or branched alkane, a C6 linear or branched alkane, a C7 linear or branched alkane, a C8 linear or branched alkane, a C9 linear or branched alkane, a C10 linear or branched alkane, a C11 linear or branched alkane, a C12 linear or branched alkane, a C13 linear or branched alkane, a C14 linear or branched alkane, a C16 linear or branched alkane, a C17 linear or branched alkane, a C18 linear or branched alkane, a C19 linear or branched alkane, or a C20 linear or branched alkane. In some embodiments, the host material 110 comprises an aromatic hydrocarbon. In some embodiments, the host material 110 comprises a polyaromatic hydrocarbon. In some embodiments, the polyaromatic hydrocarbon is optionally substituted with a methylene, carbonyl, imine, or thiocarbonyl group. In some embodiments, the host material 110 comprises a diarylketone. In some embodiments, the host material 110 comprises naphthalene, anthracene, p-terphenyl, benzoic acid, fluorene, biphenyl, benzene, n-hexane, biphenylene, ortho-terphenylene, meta-terphenylene, para-terphenylene, or benzophenone.

In some embodiments, the host material comprises an isotopically enriched host material. In some embodiments, the host material is isotopically enriched with a particular atomic isotope. In some embodiments, the isotope comprises hydrogen ($^1$H), deuterium ($^2$H), carbon-13 ($^{13}$C), nitrogen-15 ($^{15}$N), fluorine-19 ($^{19}$F), silicon-29 ($^{29}$Si), or phosphorous-31 ($^{31}$P). In some embodiments, the host material is isotopically enriched to feature the isotope at an abundance of at least about 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 91%, 92%, 93%, 94%, 95%, 96%, 97%, 98%, 99%, or more, at most about 99%, 98%, 97%, 96%, 95%, 94%, 93%, 92%, 91%, 90%, 85%, 80%, 75%, 70%, 65%, 60%, 55%, 50%, 45%, 40%, 35%, 30%, 25%, 20%, 15%, 10%, 9%, 8%, 7%, 6%, 5%, 4%, 3%, 2%, 1%, or less, or an abundance that is within a range defined by any two of the preceding values. In some embodiments, isotopic enrichment allows improved control over the magnetic environment of the dopant molecules 120 described herein.

In some embodiments, the host material 110 does not include diamond or graphite.

In some embodiments, the host material 110 is configured to contain a plurality of dopant molecules 120 described herein.

In the example shown, the system 100 comprises a plurality of dopant molecules 120. In some embodiments, the plurality of dopant molecules 120 are contained in the host material 110. In some embodiments, each dopant molecule 120 comprises a qubit for use in performing the non-classical computation. The quantum states of the qubits are described in further detail in FIGS. 2A and 2B.

In some embodiments, each dopant molecule 120 comprises an organic molecule. In some embodiments, each dopant molecule 120 comprises an organometallic molecule. In some embodiments, each dopant molecule 120 comprises an inorganic complex molecule. In some embodiments, each dopant molecule 120 comprises a GST molecule; that is, in some embodiments, each dopant molecule 120 is associated with a GST electronic manifold, as described herein with respect to FIG. 2A. In some embodiments, each dopant molecule 120 comprises an EST molecule; that is, in some embodiments, each dopant molecule 120 is associated with an EST electronic manifold, as described herein with respect to FIG. 2B. In some embodiments, each dopant molecule 120 comprises a photo-excited triplet state (PETS) molecule; that is, in some embodiments, each dopant molecule is associated with a PETS electronic manifold, as described herein with respect to FIG. 2B.

In some embodiments, each dopant molecule 120 comprises an [n]acene molecule (where n is at least about 2, 3, 4, 5, 6, or more, at most about 6, 5, 4, 3, 2, or less, or within a range defined by any two of the preceding values, such as between about 2 and about 3, about 2 and about 4, about 2 and about 5, about 2 and about 6, about 3 and about 4, about 3 and about 5, about 3 and about 6, about 4 and about 5, about 4 and about 6, or about 5 and about 6). In some embodiments, each dopant molecule 120 comprises a xanthene dye. In some embodiments, each dopant molecule 120 comprises a thioxanthene dye. In some embodiments, each dopant molecule 120 comprises a donor-acceptor molecule (comprising a donor moiety that includes an electron-rich functional group such as an amine or carbazole group and an acceptor moiety that includes an electron-deficient functional group such as an aromatic nitrile, pyrazine, triazine, benzophenone, or sulfone group). In some embodiments, each dopant molecule 120 comprises acridine, pentacene, pyrene, diazapentacene, benzophenone, or benzopyrazine.

In some embodiments, at least one dopant molecule 120 is coupled to at least one other dopant molecule 120 by a coupling interaction 130. In some embodiments, the at least one dopant molecule 120 is coupled to at least about 1, 2, 3, 4, 5, 6, 7, 8, or more other dopant molecules 120, at most about 8, 7, 6, 5, 4, 3, 2, or 1 other dopant molecules 120, or a number of dopant molecules that is within a range defined by any two of the preceding values, by the coupling interaction 130. For instance, in some embodiments, the at least one dopant molecule 120 is coupled to between about 1 and about 2, between about 1 and about 3, between about 1 and about 4, between about 1 and about 5, between about 1 and about 6, between about 1 and about 7, between about 1 and about 8, between about 2 and about 3, between about 2 and about 4, between about 2 and about 5, between about 2 and about 6, between about 2 and about 7, between about 2 and about 8, between about 3 and about 4, between about 3 and about 5, between about 3 and about 6, between about 3 and about 7, between about 3 and about 8, between about 4 and about 5, between about 4 and about 6, between about 4 and about 7, between about 4 and about 8, between about 5 and about 6, between about 5 and about 7, between about 5 and about 8, between about 6 and about 7, between about 6 and about 8, or between about 7 and about 8 other dopant molecules 120.

In some embodiments, each dopant molecule is coupled to at least one other dopant molecule by the coupling interaction 130. In some embodiments, each dopant molecule 120 is coupled to at least about 1, 2, 3, 4, 5, 6, 7, 8, or more other dopant molecules 120, at most about 8, 7, 6, 5, 4, 3, 2, or 1 other dopant molecules 120, or a number of dopant molecules that is within a range defined by any two of the preceding values, by the coupling interaction 130. For instance, in some embodiments, the each dopant molecule 120 is coupled to between about 1 and about 2, between about 1 and about 3, between about 1 and about 4, between about 1 and about 5, between about 1 and about 6, between about 1 and about 7, between about 1 and about 8, between about 2 and about 3, between about 2 and about 4, between about 2 and about 5, between about 2 and about 6, between about 2 and about 7, between about 2 and about 8, between about 3 and about 4, between about 3 and about 5, between about 3 and about 6, between about 3 and about 7, between about 3 and about 8, between about 4 and about 5, between about 4 and about 6, between about 4 and about 7, between about 4 and about 8, between about 5 and about 6, between about 5 and about 7, between about 5 and about 8, between about 6 and about 7, between about 6 and about 8, or between about 7 and about 8 other dopant molecules 120. In some embodiments, the set of dopant molecules 120 to which each dopant molecule 120 is coupled is referred to as its "nearest neighbors."

In some embodiments, the coupling interaction 130 comprises an electronic coupling interaction. In some embodiments, the coupling interaction 130 comprises an electronic dipolar coupling interaction. In some embodiments, the coupling interaction 130 has a coupling strength. In some embodiments, the coupling strength is at least about 100 Hertz (Hz), 200 Hz, 300 Hz, 400 Hz, 500 Hz, 600 Hz, 700 Hz, 800 Hz, 900 Hz, 1 kilohertz (kHz), 2 kHz, 3 kHz, 4 kHz, 5 kHz, 6 kHz, 7 kHz, 8 kHz, 9 kHz, 10 kHz, 20 kHz, 30 kHz, 40 kHz, 50 kHz, 60 kHz, 70 kHz, 80 kHz, 90 kHz, 100 kHz, 200 kHz, 300 kHz, 400 kHz, 500 kHz, 600 kHz, 700 kHz, 800 kHz, 900 kHz, 1 megahertz (MHz), 2 MHz, 3 MHz, 4 MHz, 5 MHz, 6 MHz, 7 MHz, 8 MHz, 9 MHz, 10 MHz, or more, at most about 10 MHz, 9 MHz, 8 MHz, 7 MHz, 6 MHz, 5 MHz, 4 MHz, 3 MHz, 2 MHz, 1 MHz, 900 kHz, 800 kHz, 700 kHz, 600 kHz, 500 kHz, 400 kHz, 300 kHz, 200 kHz, 100 kHz, 90 kHz, 80 kHz, 70 kHz, 60 kHz, 50 kHz, 40 kHz, 30 kHz, 20 kHz, 10 kHz, 9 kHz, 8 kHz, 7 kHz, 6 kHz, 5 kHz, 4 kHz, 3 kHz, 2 kHz, 1 kHz, 900 Hz, 800 Hz, 700 Hz, 600 Hz, 500 Hz, 400 Hz, 300 Hz, 200 Hz, 100 Hz, or less, or within a range defined by any two of the preceding values. For instance, in some embodiments, the coupling strength is between about 100 Hz and about 1,000 kHz, about 100 Hz and about 100 kHz, about 100 Hz and about 10 kHz, about 100 Hz and about 1 kHz, about 1 kHz and about 1,000 kHz, about 1 kHz and about 100 kHz, about 1 kHz and about 10 kHz, about 10 kHz and about 1,000 kHz, about 10 kHz and about 100 kHz, or about 100 kHz and about 1,000 kHz. In some embodiments, the coupling interaction 130 between each pair of dopant molecules 120 is the same. In some embodiments, the coupling interaction 130 between each pair of dopant molecules 120 is different.

In some embodiments, the plurality of dopant molecules 120 are separated by an average distance 140. In some embodiments, the average distance 140 is at least about 0.3 nanometers (nm), 0.4 nm, 0.5 nm, 0.6 nm, 0.7 nm, 0.8 nm, 0.9 nm, 1 nm, 2 nm, 3 nm, 4 nm, 5 nm, 6 nm, 7 nm, 8 nm, 9 nm, 10 nm, or more, at most about 10 nm, 9 nm, 8 nm, 7 nm, 6 nm, 5 nm, 4 nm, 3 nm, 2 nm, 1 nm, 0.9 nm, 0.8 nm, 0.7 nm, 0.6 nm, 0.5 nm, 0.4 nm, 0.3 nm, or less, or within a range defined by any two of the preceding values. For instance, in some embodiments, the average distance 140 is between about 0.3 nm and about 1 nm, about 0.3 nm and about 10 nm, or about 1 nm and about 10 nm.

In some embodiments, the plurality of dopant molecules 120 are contained in the host material 110 at a concentration of at least about $1 \times 10^6$ dopant molecules per cubic micrometer ($\mu m^{-3}$), $2 \times 10^6$ $\mu m^{-3}$, $3 \times 10^6$ $\mu m^{-3}$, $4 \times 10^6$ $\mu m^{-3}$, $5 \times 10^6$ $\mu m^{-3}$, $6 \times 10^6$ $\mu m^{-3}$, $7 \times 10^6$ $\mu m^{-3}$, $8 \times 10^6$ $\mu m^{-3}$, $9 \times 10^6$ $\mu m^{-3}$, $1 \times 10^7$ $\mu m^{-3}$, $2 \times 10^7$ $\mu m^{-3}$, $3 \times 10^7$ $\mu m^{-3}$, $4 \times 10^7$ $\mu m^{-3}$, $5 \times 10^7$ $\mu m^{-3}$, $6 \times 10^7$ $\mu m^{-3}$, $7 \times 10^7$ $\mu m^{-3}$, $8 \times 10^7$ $\mu m^{-3}$, $9 \times 10^7$ $\mu m^{-3}$, $1 \times 10^8$ $\mu m^{-3}$, $2 \times 10^8$ $\mu m^{-3}$, $3 \times 10^8$ $\mu m^{-3}$, $4 \times 10^8$ $\mu m^{-3}$, $5 \times 10^8$ $\mu m^{-3}$, $6 \times 10^8$ $\mu m^{-3}$, $7 \times 10^8$ $\mu m^{-3}$, $8 \times 10^8$ $\mu m^{-3}$, $9 \times 10^8$ $\mu m^{-3}$, $1 \times 10^9$ $\mu m^{-3}$, $2 \times 10^9$ $\mu m^{-3}$, $3 \times 10^9$ $\mu m^{-3}$, $4 \times 10^9$ $\mu m^{-3}$, $5 \times 10^9$ $\mu m^{-3}$, $6 \times 10^9$ $\mu m^{-3}$, $7 \times 10^9$ $\mu m^{-3}$, $8 \times 10^9$ $\mu m^{-3}$, $9 \times 10^9$ $\mu m^{-3}$, $1 \times 10^{10}$ $\mu m^{-3}$, $2 \times 10^{10}$ $\mu m^{-3}$, $3 \times 10^{10}$ $\mu m^{-3}$, $4 \times 10^{10}$ $\mu m^{-3}$, $5 \times 10^{10}$ $\mu m^{-3}$, $6 \times 10^{10}$ $\mu m^{-3}$, $7 \times 10^{10}$ $\mu m^{-3}$, $8 \times 10^{10}$ $\mu m^{-3}$, $9 \times 10^{10}$ $\mu m^{-3}$, $1 \times 10^{11}$ $\mu m^{-3}$, $2 \times 10^{11}$ $\mu m^{-3}$, $3 \times 10^{11}$ $\mu m^{-3}$, $4 \times 10^{11}$ $\mu m^{-3}$, $5 \times 10^{11}$ $\mu m^{-3}$, $6 \times 10^{11}$ $\mu m^{-3}$, $7 \times 10^{11}$ $\mu m^{-3}$, $8 \times 10^{11}$ $\mu m^{-3}$, $9 \times 10^{11}$ $\mu m^{-3}$, $1 \times 10^{12}$ $\mu m^{-3}$, or more, at most about $1 \times 10^{12}$ $\mu m^{-3}$, $9 \times 10^{11}$ $\mu m^{-3}$, $8 \times 10^{11}$ $\mu m^{-3}$, $7 \times 10^{11}$ $\mu m^{-3}$, $6 \times 10^{11}$ $\mu m^{-3}$, $5 \times 10^{11}$ $\mu m^{-3}$, $4 \times 10^{11}$ $\mu m^{-3}$, $3 \times 10^{11}$ $\mu m^{-3}$, $2 \times 10^{11}$ $\mu m^{-3}$, $1 \times 10^{11}$ $\mu m^{-3}$, $9 \times 10^{10}$ $\mu m^{-3}$, $8 \times 10^{10}$ $\mu m^{-3}$, $7 \times 10^{10}$ $\mu m^{-3}$, $6 \times 10^{10}$ $\mu m^{-3}$, $5 \times 10^{10}$ $\mu m^{-3}$, $4 \times 10^{10}$ $\mu m^{-3}$, $3 \times 10^{10}$ $\mu m^{-3}$, $2 \times 10^{10}$ $\mu m^{-3}$, $1 \times 10^{10}$ $\mu m^{-3}$, $9 \times 10^9$ $\mu m^{-3}$, $8 \times 10^9$ $\mu m^{-3}$, $7 \times 10^9$ $\mu m^{-3}$, $6 \times 10^9$ $\mu m^{-3}$, $5 \times 10^9$ $\mu m^{-3}$, $4 \times 10^9$ $\mu m^{-3}$, $3 \times 10^9$ $\mu m^{-3}$, $2 \times 10^9$ $\mu m^{-3}$, $1 \times 10^9$ $\mu m^{-3}$, $9 \times 10^8$ $\mu m^{-3}$, $8 \times 10^8$ $\mu m^{-3}$, $7 \times 10^8$ $\mu m^{-3}$, $6 \times 10^8$ $\mu m^{-3}$, $5 \times 10^8$ $\mu m^{-3}$, $4 \times 10^8$ $\mu m^{-3}$, $3 \times 10^8$ $\mu m^{-3}$, $2 \times 10^8$ $\mu m^{-3}$, $1 \times 10^8$ $\mu m^{-3}$, $9 \times 10^7$ $\mu m^{-3}$, $8 \times 10^7$ $\mu m^{-3}$, $7 \times 10^7$ $\mu m^{-3}$, $6 \times 10^7$ $\mu m^{-3}$, $5 \times 10^7$ $\mu m^{-3}$, $4 \times 10^7$ $\mu m^{-3}$, $3 \times 10^7$ $\mu m^{-3}$, $2 \times 10^7$ $\mu m^{-3}$, $1 \times 10^7$ $\mu m^{-3}$, $9 \times 10^6$ $\mu m^{-3}$, $8 \times 10^6$ $\mu m^{-3}$, $7 \times 10^6$ $\mu m^{-3}$, $6 \times 10^6$ $\mu m^{-3}$, $5 \times 10^6$ $\mu m^{-3}$, $4 \times 10^6$ $\mu m^{-3}$, $3 \times 10^6$ $\mu m^{-3}$, $2 \times 10^6$ $\mu m^{-3}$, $1 \times 10^6$ $\mu m^{-3}$, or less, or a concentration that is within a range defined by any two of the preceding values.

Although depicted as comprising 9 dopant molecules 120 in FIG. 1A, the system 100 may comprise any number of dopant molecules 120. For instance, the system 100 may comprise at least about 1, 2, 3, 4, 5, 6, 7, 8, 9, 10, 20, 30, 40, 50, 60, 70, 80, 90, 100, 200, 300, 400, 500, 600, 700, 800, 900, 1,000, 2,000, 3,000, 4,000, 5,000, 6,000, 7,000, 8,000, 9,000, 10,000, 20,000, 30,000, 40,000, 50,000, 60,000, 70,000, 80,000, 90,000, 100,000, 200,000, 300,000, 400,000, 500,000, 600,000, 7000,000, 800,000, 900,000, 1,000,000, or more dopant molecules 120, at most about 1,000,000, 900,000, 800,000, 700,000, 600,000, 500,000, 400,000, 300,000, 200,000, 100,000, 90,000, 80,000, 70,000, 60,000, 50,000, 40,000, 30,000, 20,000, 10,000, 9,000, 8,000, 7,000, 6,000, 5,000, 4,000, 3,000, 2,000, 1,000, 900, 800, 700, 600, 500, 400, 300, 200, 100, 90, 80, 70, 60, 50, 40, 30, 20, 10, 9, 8, 7, 6, 5, 4, 3, 2, or 1 dopant molecules 120, or a number of dopant molecules 120 that is within a range defined by any two of the preceding values.

Although FIG. 1A depicts the dopant molecules 120 arranged in an array, this depiction is not intended to be limiting. In some embodiments, each of the dopant molecules 120 can have any number of nearest neighbors described herein. In some embodiments, different dopant molecules 120 can have a different number of nearest neighbors. For example, one dopant molecule 120 can have 8 nearest neighbors and another dopant molecule 120 can have 2 nearest neighbors. In some embodiments, the dopant molecules 120 are arranged in a regular, irregular, or disordered array. In some embodiments, the spatial arrangements of nearest neighbors around each of the dopant molecules 120 differs. In some embodiments, separations between each nearest neighbor and each of the dopant molecules 120 differs.

Figure 1B:
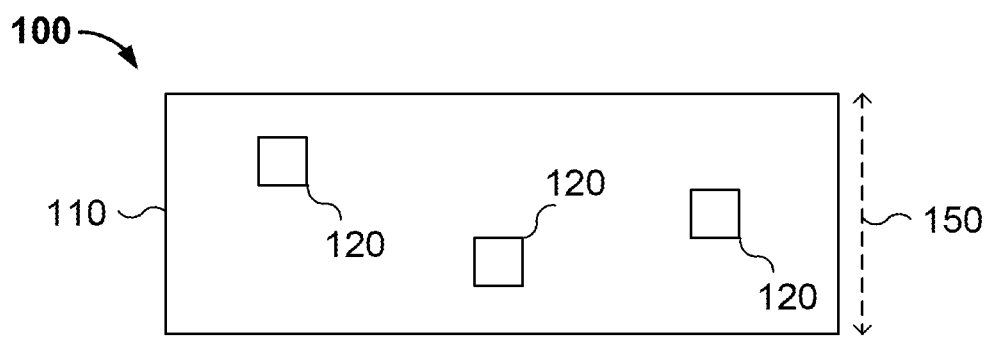
FIG. 1B shows a side view of the system of FIG. 1A, in accordance with various embodiments.

FIG. 1B shows a side view of the system 100, in accordance with various embodiments. In the example shown, the system 100 comprises the at least one host material 110 and the plurality of dopant molecules 120.

In the example shown, the host material 110 comprises a thickness 150. In some embodiments, the host material 110 comprises a thin film. That is, in some embodiments, the thickness 150 is at least about 0.3 nm, 0.4 nm, 0.5 nm, 0.6 nm, 0.7 nm, 0.8 nm, 0.9 nm, 1 nm, 2 nm, 3 nm, 4 nm, 5 nm, 6 nm, 7 nm, 8 nm, 9 nm, 10 nm, 20 nm, 30 nm, 40 nm, 50 nm, 60 nm, 70 nm, 80 nm, 90 nm, 100 nm, 200 nm, 300 nm, 400 nm, 500 nm, 600 nm, 700 nm, 800 nm, 900 nm, 1,000 nm, or more, at most about 1,000 nm, 900 nm, 800 nm, 700 nm, 600 nm, 500 nm, 400 nm, 300 nm, 200 nm, 100 nm, 90 nm, 80 nm, 70 nm, 60 nm, 50 nm, 40 nm, 30 nm, 20 nm, 10 nm, 9 nm, 8 nm, 7 nm, 6 nm, 5 nm, 4 nm, 3 nm, 2 nm, 1 nm, 0.9 nm, 0.8 nm, 0.7 nm, 0.6 nm, 0.5 nm, 0.4 nm, 0.3 nm, or less, or within a range defined by any two of the preceding values. For instance, in some embodiments, the thickness 150 is between about 0.3 nm and about 1 nm, about 0.3 nm and about 10 nm, about 0.3 nm and about 100 nm, about 0.3 nm and about 1,000 nm, about 1 nm and about 10 nm, about 1 nm and about 10 nm, about 1 nm and about 100 nm, about 1 nm and about 1,000 nm, about 10 nm and about 100 nm, about 10 nm and about 1,000 nm, or about 100 nm and about 1,000 nm. In some embodiments, the use of a thin film host material 110 allows the formation of a pseudo-two-dimensional (pseudo-2D) layer of dopant molecules 120, as described herein.

In some embodiments, the thin film is formed atop a substrate (not shown in FIG. 1B). In some embodiments, the substrate comprises the host material 110. In some embodiments, the substrate comprises a microfabrication processing material such as silicon, glass, or sapphire. In some embodiments, the thin film is formed using one or more microfabrication techniques such as wet cleaning, Piranha cleaning, RCA cleaning, surface passivation, spin coating, dip coating, chemical vapor deposition (CVD), atmospheric pressure CVD, low-pressure CVD, ultrahigh vacuum CVD, aerosol assisted CVD, direct liquid injection CVD, hot wall CVD, cold wall CVD, microwave plasma-assisted CVD, plasma-enhanced CVD (PECVD), remote PECVD, low-energy PECVD, atomic-layer CVD, combustion CVD, rapid thermal CVD, photo-initiated CVD, laser CVD, vapor phase epitaxy, physical vapor deposition, sputter deposition, evaporative deposition, pulsed laser deposition, pulsed electron deposition, atomic layer deposition, molecular beam epitaxy, etching, wet etching, dry etching, reactive-ion etching (RIE), deep RIE, atomic layer etching, or self-assembly (to form a self-assembled monolayer).

In some embodiments, the host material 110 has a thickness 150 of at least about 1 nm, 2 nm, 3 nm, 4 nm, 5 nm, 6 nm, 7 nm, 8 nm, 9 nm, 10 nm, 20 nm, 30 nm, 40 nm, 50 nm, 60 nm, 70 nm, 80 nm, 90 nm, 100 nm, 200 nm, 300 nm, 400 nm, 500 nm, 600 nm, 700 nm, 800 nm, 900 nm, 1 micrometer ($\mu m$), 2 $\mu m$, 3 $\mu m$, 4 $\mu m$, 5 $\mu m$, 6 $\mu m$, 7 $\mu m$, 8 $\mu m$, 9 $\mu m$, 10 $\mu m$, 20 $\mu m$, 30 $\mu m$, 40 $\mu m$, 50 $\mu m$, 60 $\mu m$, 70 $\mu m$, 80 $\mu m$, 90 $\mu m$, 100 $\mu m$, 200 $\mu m$, 300 $\mu m$, 400 $\mu m$, 500 $\mu m$, 600 $\mu m$, 700 $\mu m$, 800 $\mu m$, 900 $\mu m$, 1 millimeter (mm), 2 mm, 3 mm, 4 mm, 5 mm, 6 mm, 7 mm, 8 mm, 9 mm, 10 mm, or more, at most about 10 mm, 9 mm, 8 mm, 7 mm, 6 mm, 5 mm, 4 mm, 3 mm, 2 mm, 1 mm, 900 $\mu m$, 800 $\mu m$, 700 $\mu m$, 600 $\mu m$, 500 $\mu m$, 400 $\mu m$, 300 $\mu m$, 200 $\mu m$, 100 $\mu m$, 90 $\mu m$, 80 $\mu m$, 70 $\mu m$, 60 $\mu m$, 50 $\mu m$, 40 $\mu m$, 30 $\mu m$, 20 $\mu m$, 10 $\mu m$, 9 $\mu m$, 8 $\mu m$, 7 $\mu m$, 6 $\mu m$, 5 $\mu m$, 4 $\mu m$, 3 $\mu m$, 2 $\mu m$, 1 $\mu m$, 900 nm, 800 nm, 700 nm, 600 nm, 500 nm, 400 nm, 300 nm, 200 nm, 100 nm, 90 nm, 80 nm, 70 nm, 60 nm, 50 nm, 40 nm, 30 nm, 20 nm, 10 nm, 9 nm, 8 nm, 7 nm, 6 nm, 5 nm, 4 nm, 3 nm, 2 nm, 1 nm, or less, or within a range defined by any two of the preceding values. In some embodiments, the host material 110 is not formed on a substrate.

In the example shown, the plurality of dopant molecules 120 are arranged in a pseudo-2D layer. In some embodiments, the pseudo-2D layer comprises a thin slice of space to which the plurality of dopant molecules 120 are confined. In some embodiments, vectors can be drawn between pairs of dopant molecules 120 in the pseudo-2D layer. In some embodiments, the vectors make angles with a plane defined by the host material 110. In some embodiments, the angles are at least about 0 degrees, 1 degree, 2 degrees, 3 degrees, 4 degrees, 5 degrees, 6 degrees, 7 degrees, 8 degrees, 9 degrees, 10 degrees, 15 degrees, 20 degrees, 25 degrees, 30 degrees, 35 degrees, 40 degrees, 45 degrees, 50 degrees, 55 degrees, 60 degrees, 65 degrees, 70 degrees, 75 degrees, 80 degrees, 85 degrees, or 90 degrees, at most about 90 degrees, 85 degrees, 80 degrees, 75 degrees, 70 degrees, 65 degrees, 60 degrees, 55 degrees, 50 degrees, 45 degrees, 40 degrees, 35 degrees, 30 degrees, 25 degrees, 20 degrees, 15 degrees, 10 degrees, 9 degrees, 8 degrees, 7 degrees, 6 degrees, 5 degrees, 4 degrees, 3 degrees, 2 degrees, 1 degrees, or 0 degrees, or within a range defined by any two of the preceding values. In some embodiments, arranging the plurality of dopant molecules 120 in the pseudo-2D layer reduces the extent to which each of the plurality of dopant molecules 120 must interact with the nearest neighbors located substantially above or below them, simplifying the quantum dynamics of the plurality of dopant molecules 120.

While FIG. 1B depicts a pseudo-2D layer comprising a thin slice of space to which the plurality of dopant molecules 120 are confined, the disclosed embodiments are not so limited. In some embodiments, the plurality of dopant molecules 120 can be disposed within a thicker layer. In such a thicker layer, each of the plurality of dopant molecules 120 may interact with the nearest neighbors located substantially above or below them.

Electronic Triplet States for Use as Qubit Basis States

Figure 2A:
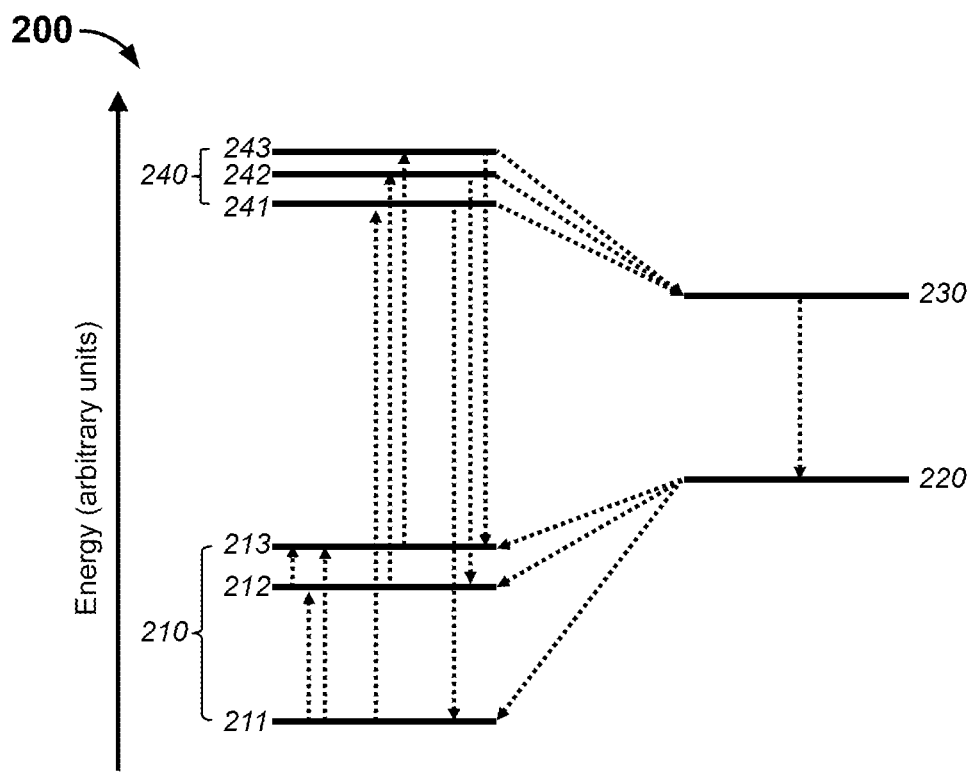
FIG. 2A shows an example of an electronic energy level diagram for a ground state triplet (GST) molecule, in accordance with various embodiments.

FIG. 2A shows an example of an electronic energy level diagram 200 for a GST molecule. In some embodiments, the GST molecule is used as a qubit (e.g., a qubit as described herein with respect to FIGS. 1A and 1B). In the example shown, the GST molecule is associated with a GST electronic manifold 210, a first singlet electronic state 220, a second singlet electronic state 230, and an EST electronic manifold 240. In some embodiments, the GST electronic manifold 210 comprises a first triplet state 211, a second triplet state 212, and a third triplet state 213. In some embodiments, the first triplet state 211, second triplet state 212, and third triplet state 213 represent the lowest-energy electronic states of the GST molecule. In some embodiments, the first triplet state 211 is denoted by $|T_1\rangle$, the second triplet state 212 is denoted by $|T_2\rangle$, and the third triplet state 213 is denoted by $|T_3\rangle$. In some embodiments, the EST electronic manifold 240 comprises a first triplet state 241, a second triplet state 242, and a third triplet state 243. In some embodiments, the first singlet electronic state 220, second singlet electronic state 230, and EST electronic manifold 240 each represent higher-energy electronic states than the GST molecule. As depicted in FIG. 2A, in some embodiments, the second singlet electronic state 230 is lower in energy than the EST electronic manifold 240. However, in other embodiments, the second singlet electronic state 230 is higher in energy than the EST electronic manifold 240

In some embodiments, at thermal equilibrium, the GST electronic state 210 is highly populated (i.e., the electronic wavefunction of the GST molecule is heavily biased to the GST electronic state 210, with relatively equal contributions to the first triplet state 211, second triplet state 212, and third triplet state 213), while the first singlet electronic state 220, second electronic singlet state 230, first triplet state 241, second triplet state 242, and third triplet state 243 are not highly populated.

In some embodiments, the GST molecule is configured to absorb electromagnetic energy to drive the population from the first triplet state 211, second triplet state 212, or third triplet state 213 to the first singlet electronic state 220, second singlet electronic state 230, first triplet state 241, second triplet state 242, or third triplet state 243. In some embodiments, the GST molecule is configured to relax via radiative decay back to the first triplet state 211, second triplet state 212, or third triplet state 213; or to the first singlet electronic state 220 or second singlet electronic state 230 via inter-system crossing (ISC). In some embodiments, continuous absorption of the electromagnetic energy selectively drives population into any combination of the first triplet state 211, second triplet state 212, and third triplet state 213, thereby creating a non-equilibrium electronic state distribution. In this manner, any combination of the first triplet state 211, second triplet state 212, and third triplet state 213 may be "hyperpolarized," as described herein.

Figure 2B:
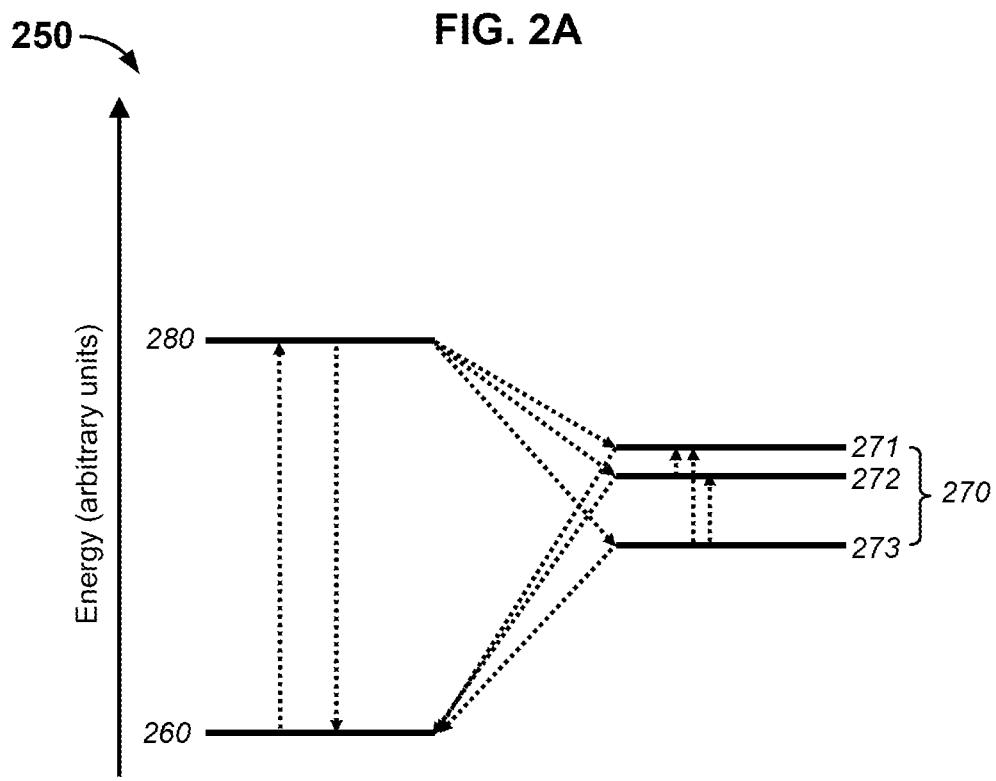
FIG. 2B shows an example of an electronic energy level diagram for an excited state triplet (EST) molecule, in accordance with various embodiments.

FIG. 2B shows an example of an electronic energy level diagram 250 for an EST molecule. In some embodiments, the EST molecule is used as a qubit (e.g., a qubit as described herein with respect to FIGS. 1A and 1B). In the example shown, the EST molecule is associated with a ground-state singlet electronic state 260, an EST electronic manifold 270, and an excited-state singlet electronic state 280. In some embodiments, the EST electronic manifold 270 comprises a first triplet state 271, a second triplet state 272, and a third triplet state 273. In some embodiments, the ground-state singlet electronic state 260 represents the lowest-energy electronic state of the EST molecule, the first triplet state 271, second state triplet 272, and third triplet state 273 represent the next-lowest-energy electronic states of the EST molecule, and the excited-state singlet electronic state 280 represents the next-next-lowest energy electronic state of the EST molecule. In some embodiments, the first triplet state 271 is denoted by $|T_1\rangle$, the second triplet state 272 is denoted by $|T_2\rangle$, and the third triplet state 273 is denoted by $|T_3\rangle$.

In some embodiments, at thermal equilibrium, the ground-state singlet electronic state 260 is highly populated (i.e., the electronic wavefunction of the EST molecule is heavily biased to the ground-state singlet electronic state 260), while the first triplet state 271, second triplet state 272, third triplet state 273, and excited-state singlet electronic state 280 are not highly populated.

In some embodiments, the EST molecule is configured to absorb electromagnetic energy to drive the population from the ground-state singlet electronic state 260 to the excited-state singlet electronic state 280. In some embodiments, the EST molecule is configured to relax via radiative decay back to the ground-state singlet electronic state 260 or to any combination of the first triplet state 271, second triplet state 272, and third triplet state 273 via inter-system crossing (ISC). In some embodiments, continuous absorption of the electromagnetic energy selectively drives population into any combination of the first triplet state 271, second triplet state 272, and third triplet state 273, thereby creating a non-equilibrium electronic state distribution.

Alternatively, in some embodiments, the EST molecule is configured to absorb electromagnetic energy to drive the population from the ground-state singlet electronic state 260 directly to any combination of the first triplet state 271, second triplet state 272, and third triplet state 273, thereby creating the non-equilibrium electronic state distribution. In either manner, any combination of the first triplet state 271, second triplet state 272, and third triplet state 273 may be "hyperpolarized," as described herein.

Regardless of whether the qubit comprises a GST molecule or an EST molecule, in some embodiments, linear combinations of the first triplet state, $|T_1\rangle$ second triplet state $|T_2\rangle$, and third triplet state $|T_3\rangle$ may be utilized as qubit basis states for the non-classical computation. Thus, the qubit may comprise a first qubit basis state that is a first linear combination (e.g., with respect to a laboratory frame of reference, a rotating frame of reference, or another suitable time-independent or time-dependent frame of reference) of the first triplet state $|T_1\rangle$, second triplet state $|T_2\rangle$, and third triplet state $|T_3\rangle$ (e.g., first qubit basis state $|0\rangle = \alpha_1|T_1\rangle + \alpha_2|T_2\rangle + \alpha_3|T_3\rangle$) and a second qubit basis state that is a second linear combination of first triplet state $|T_1\rangle$, second triplet state $|T_2\rangle$, and third triplet state $|T_3\rangle$ (e.g., second qubit basis state $|1\rangle = \beta_1|T_1\rangle + \beta_2|T_2\rangle + \beta_3|T_3\rangle$) In general, $\alpha_1, \alpha_2, \alpha_3, \beta_1, \beta_2$, and $\beta_3$ may each be any complex number, subject to the normalization conditions $|\alpha_1|^2 + |\alpha_2|^2 + |\alpha_3|^2 = 1$ and $|\beta_1|^2 + |\beta_2|^2 + |\beta_3|^2 = 1$. Moreover, $\alpha_1, \alpha_2, \alpha_3, \beta_1, \beta_2$, and $\beta_3$ should generally be chosen to make the first qubit basis state and the second qubit basis state different (e.g., orthogonal) from one another.

In some embodiments, a lifetime (e.g., a coherence lifetime or a relaxation lifetime) of the first qubit basis state or the second qubit basis state is at least about 100 microseconds (μs), 200 μs, 300 μs, 400 μs, 500 μs, 600 μs, 700 μs, 800 μs, 900 μs, 1 millisecond (ms), 2 ms, 3 ms, 4 ms, 5 ms, 6 ms, 7 ms, 8 ms, 9 ms, 10 ms, 15 ms, 20 ms, 25 ms, 30 ms, 35 ms, 40 ms, 45 ms, 50 ms, 55 ms, 60 ms, 65 ms, 70 ms, 75 ms, 80 ms, 85 ms, 90 ms, 95 ms, 100 ms, 125 ms, 150 ms, 175 ms, 200 ms, 225 ms, 250 ms, 275 ms, 300 ms, 325 ms, 350 ms, 375 ms, 400 ms, 425 ms, 450 ms, 475 ms, 500 ms, 525 ms, 550 ms, 575 ms, 600 ms, 625 ms, 650 ms, 675 ms, 700 ms, 725 ms, 800 ms, 825 ms, 850 ms, 875 ms, 900 ms, 925 ms, 950 ms, 975 ms, 1 second (s), 2 s, 3 s, 4 s, 5 s, 6 s, 7 s, 8 s, 9 s, 10 s, 20 s, 30 s, 40 s, 50 s, 1 minute (min), 2 min, 3 min, 4 min, 5 min, 6 min, 7 min, 8 min, 9 min, 10 min, 20 min, 30 min, 40 min, 50 min, 1 hour (h), 2 h, 3 h, 4 h, 5 h, 6 h, 7 h, 8 h, 9 h, 10 h, or more, at most about 10 h, 9 h, 8 h, 7 h, 6 h, 5 h, 4 h, 3 h, 2 h, 1 h, 50 min, 40 min, 30 min, 20 min, 10 min, 9 min, 8 min, 7 min, 6 min, 5 min, 4 min, 3 min, 2 min, 1 min, 50 s, 40 s, 30 s, 20 s, 10 s, 9 s, 8 s, 7 s, 6 s, 5 s, 4 s, 3 s, 2 s, 1 s, 975 ms, 950 ms, 925 ms, 900 ms, 875 ms, 850 ms, 825 ms, 800 ms, 775 ms, 750 ms, 725 ms, 700 ms, 675 ms, 650 ms, 625 ms, 600 ms, 575 ms, 550 ms, 525 ms, 500 ms, 475 ms, 450 ms, 425 ms, 400 ms, 375 ms, 350 ms, 325 ms, 300 ms, 275 ms, 250 ms, 225 ms, 200 ms, 175 ms, 150 ms, 125 ms, 100 ms, 95 ms, 90 ms, 85 ms, 80 ms, 75 ms, 70 ms, 65 ms, 60 ms, 55 ms, 50 ms, 45 ms, 40 ms, 35 ms, 30 ms, 25 ms, 20 ms, 15 ms, 10 ms, 9 ms, 8 ms, 7 ms, 6 ms, 5 ms, 4 ms, 3 ms, 2 ms, 1 ms, 900 µs, 800 µs, 700 µs, 600 µs, 500 µs, 400 µs, 300 µs, 200 µs, 100 µs, or less, or a lifetime that is within a range defined by any two of the preceding values.

In some embodiments, the lifetime is defined as the half-life for the electronic state of the qubit to return from a hyperpolarized electronic state distribution to a thermal equilibrium electronic state distribution. In some embodiments, the lifetime is measured at an intended operating temperature of the qubit, such as a temperature of at least about 1 K, 2 K, 3 K, 4 K, 5 K, 6 K, 7 K, 8 K, 9 K, 10 K, 15 K, 20 K, 25 K, 30 K, 35 K, 40 K, 45 K, 50 K, or more, at most about 50 K, 45 K, 40 K, 35 K, 30 K, 25 K, 20 K, 15 K, 10 K, 9 K, 8 K, 7 K, 6 K, 5 K, 4 K, 3 K, 2 K, 1 K, or less, or a temperature that is between any two of the preceding values (such as between about 4 K and about 20 K). In some embodiments, the dipolar coupling strength described herein with respect to FIGS. 1A and 1B (e.g., the coupling interaction 130 depicted in FIGS. 1A and 1B) is greater than a multiple of an inverse of the lifetime. In some embodiments, the multiple is at least about 1, 2, 3, 4, 5, 6, 7, 8, 9, 10, or more, at most about 10, 9, 8, 7, 6, 5, 4, 3, 2, 1, or less, or within a range defined by any two of the preceding values.

Optical Hyperpolarization and Initialization of Qubit States

In some embodiments, hyperpolarization allows the non-classical computation to be performed with a high SNR. In some embodiments, hyperpolarization allows the qubit to be initialized in the first qubit basis state or the second qubit basis state (or any linear combination thereof) to thereby initialize the non-classical computation. In some embodiments, hyperpolarization permits coherent manipulation of the quantum state of the qubit to perform the non-classical computation.

In some embodiments, hyperpolarization allows one or a plurality of the qubits to be placed into a particular quantum state (e.g., the first qubit basis state, the second qubit basis state, or any linear combination thereof). In some embodiments, the qubits are initialized following such hyperpolarization.

In the context of a GST molecule or an EST molecule, in some embodiments, hyperpolarization describes a condition in which an absolute value of a difference between a population of electronic states being in one state (e.g., the first singlet electronic state of a GST molecule or the ground-state singlet electronic state of an EST molecule) and a population of electronic states being in another state (e.g., any combination of the first triplet state $|T_1\rangle$, second triplet state $|T_2\rangle$, and third triplet state $|T_3\rangle$ of a GST molecule or an EST molecule) exceeds the absolute value of the corresponding difference at thermal equilibrium.

In some embodiments, a population difference between two electronic states is the difference between the population of the two electronic states divided by the total population of the two electronic states. A population difference may be expressed as a fractional population difference or a percentage population difference. In some embodiments, the population difference (expressed as a percentage) is at least about 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or more, at most about 95%, 90%, 85%, 80%, 75%, 70%, 65%, 60%, 55%, 50%, 45%, 40%, 35%, 30%, 25%, 20%, 15%, 10%, 9%, 8%, 7%, 6%, 5%, 4%, 3%, 2%, 1%, or less, or within a range defined by any two of the preceding values.

As described herein, in some embodiments, the qubit (whether a GST molecule or an EST molecule) is configured to absorb electromagnetic energy to drive population into any combination of the first triplet state $|T_1\rangle$, second triplet state $|T_2\rangle$, and third triplet state $|T_3\rangle$, thereby creating hyperpolarization. In some embodiments, the electromagnetic energy has a central wavelength that is selected to drive the population to any combination of the first triplet state $|T_1\rangle$, second triplet state $|T_2\rangle$, and third triplet state $|T_3\rangle$. In some embodiments, the central wavelength is within an infrared (IR), visible, or ultraviolet (UV) portion of the electromagnetic spectrum. In some embodiments, the central wavelength is at least about 200 nm, 210 nm, 220 nm, 230 nm, 240 nm, 250 nm, 260 nm, 270 nm, 280 nm, 290 nm, 300 nm, 310 nm, 320 nm, 330 nm, 340 nm, 350 nm, 360 nm, 370 nm, 380 nm, 390 nm, 400 nm, 410 nm, 420 nm, 430 nm, 440 nm, 450 nm, 460 nm, 470 nm, 480 nm, 490 nm, 500 nm, 510 nm, 520 nm, 530 nm, 540 nm, 550 nm, 560 nm, 570 nm, 580 nm, 590 nm, 600 nm, 610 nm, 620 nm, 630 nm, 640 nm, 650 nm, 660 nm, 670 nm, 680 nm, 685 nm, 690 nm, 700 nm, 710 nm, 720 nm, 730 nm, 740 nm, 750 nm, 760 nm, 770 nm, 780 nm, 790 nm, 800 nm, 810 nm, 820 nm, 830 nm, 840 nm, 850 nm, 860 nm, 870 nm, 880 nm, 890 nm, 900 nm, 910 nm, 920 nm, 930 nm, 940 nm, 950 nm, 960 nm, 970 nm, 980 nm, 990 nm, 1,000 nm, or more, at most about 1,000 nm, 990 nm, 980 nm, 970 nm, 960 nm, 950 nm, 940 nm, 930 nm, 920 nm, 910 nm, 900 nm, 890 nm, 880 nm, 870 nm, 860 nm, 850 nm, 840 nm, 830 nm, 820 nm, 810 nm, 800 nm, 790 nm, 780 nm, 770 nm, 760 nm, 750 nm, 740 nm, 730 nm, 720 nm, 710 nm, 700 nm, 690 nm, 680 nm, 670 nm, 660 nm, 650 nm, 640 nm, 630 nm, 620 nm, 610 nm, 600 nm, 590 nm, 580 nm, 570 nm, 560 nm, 550 nm, 540 nm, 530 nm, 520 nm, 510 nm, 500 nm, 490 nm, 480 nm, 470 nm, 460 nm, 450 nm, 440 nm, 430 nm, 420 nm, 410 nm, 400 nm, 390 nm, 380 nm, 370 nm, 360 nm, 350 nm, 340 nm, 330 nm, 320 nm, 310 nm, 300 nm, 290 nm, 280 nm, 270 nm, 260 nm, 250 nm, 240 nm, 230 nm, 220 nm, 210 nm, 200 nm, or less, or within a range defined by any two of the preceding values.

Optical Initialization of Individual Qubits

Returning to the discussion of FIGS. 1A and 1B, in some embodiments, different dopant molecules 120 experience different physico-chemical environments due to their differing positions or orientations in the host material 110. In some embodiments, the different physico-chemical environments cause the different dopant molecules 120 to have slightly different electronic energy level structures. For instance, returning to the discussion of FIG. 2A, the energy differences between any two of the first triplet state 211, second triplet state 212, third triplet state 213, first singlet electronic state 220, second singlet state 230, first triplet state 241, second triplet state 242, and third triplet state 243 may be dependent upon the physico-chemical environment of the associated dopant molecule, shifting the wavelength or frequency of the electromagnetic energy required to drive transitions between those two states. Similarly, returning to the discussion of FIG. 2B, the energy differences between any two of the ground-state singlet electronic state 260, first triplet state 271, second triplet state 272, third triplet state 273, and excited-state singlet electronic state 280 may be dependent upon the physico-chemical environment of the associated dopant molecule, shifting the wavelength or frequency of the electromagnetic energy required to drive transitions between those two states.

Returning to the discussion of FIGS. 1A and 1B, in some embodiments, the different electronic energy level structures of the dopant molecules 120 may allow individual addressing of each dopant molecule 120. For instance, each dopant molecule 120 may be individually optically addressed if a bandwidth of the optical energy used to initialize each dopant molecule is sufficiently narrow (e.g., the bandwidth is small compared with a difference between the wavelength required to initialize a given dopant molecule 120 and the wavelength required to initialize other dopant molecules 120).

For instance, a first dopant molecule 120 and a second dopant molecule 120 may have different electronic energy level structures. Thus, in some embodiments, the first dopant molecule 120 may be configured to absorb first electromagnetic energy having a first central wavelength and the second dopant molecule 120 may be configured to absorb second electromagnetic energy having a second central wavelength. In some embodiments, the first or second central wavelength comprises any central wavelength described herein. In some embodiments, the first and second central wavelengths are different from one another.

In some embodiments, the first central wavelength is associated with a first range of wavelengths having a first bandwidth. In some embodiments, the first bandwidth is measured as a first full width at half maximum (FWHM). In some embodiments, the second central wavelength is associated with a second range of wavelengths having a second bandwidth. In some embodiments, the second bandwidth is measured as a second FWHM bandwidth. In some embodiments, the first bandwidth or the second bandwidth is at least about 1 MHz, 2 MHz, 3 MHz, 4 MHz, 5 MHz, 6 MHz, 7 MHz, 8 MHz, 9 MHz, 10 MHz, 15 MHz, 20 MHz, 25 MHz, 30 MHz, 35 MHz, 40 MHz, 45 MHz, 50 MHz, 55 MHz, 60 MHz, 65 MHz, 70 MHz, 75 MHz, 80 MHz, 85 MHz, 90 MHz, 95 MHz, 100 MHz, or more, at most about 100 MHz, 95 MHz, 90 MHz, 85 MHz, 80 MHz, 75 MHz, 70 MHz, 65 MHz, 60 MHz, 55 MHz, 50 MHz, 45 MHz, 40 MHz, 35 MHz, 30 MHz, 25 MHz, 20 MHz, 15 MHz, 10 MHz, 9 MHz, 8 MHz, 7 MHz, 6 MHz, 5 MHz, 4 MHz, 3 MHz, 2 MHz, 1 MHz, or less, or within a range defined by any two of the preceding values.

In some embodiments, the first range of wavelengths and the second range of wavelengths are different. In some embodiments, the first range of wavelengths and the second range of wavelengths do not overlap (e.g., within the first FWHM and the second FWHM). In some embodiments, the first FWHM and the second FWHM are similar to or wider than the bandwidth of an optical source directed to the first dopant molecule 120 and the second dopant molecule 120. In some embodiments, the non-overlapping nature of the first and second ranges of wavelengths permits the first dopant molecule 120 to absorb optical energy while the second dopant molecule 120 does not absorb the optical energy. In some embodiments, the non-overlapping nature of the first and second ranges of wavelengths permits the second dopant molecule 120 to absorb optical energy while the first dopant molecule 120 does not absorb the optical energy. This procedure may be referred to as "individual optical initialization" of the first and second dopant molecules 120. In some embodiments, individual optical initialization of the first and second dopant molecules 120 causes the first and second dopant molecules 120 to emit different amounts of the optical energy. In some embodiments, measuring the optical energy collapses the quantum state of the at least one dopant molecule into an electronic energy eigenstate of the at least one dopant molecule, thereby initializing the dopant molecule into a desired initial quantum state.

Although discussed in terms of two dopant molecules 120, the principles of individual optical initialization described herein may be extended to any number of dopant molecules 120. For instance, individual optical initialization may be applied to at least about 2, 3, 4, 5, 6, 7, 8, 9, 10, 20, 30, 40, 50, 60, 70, 80, 90, 100, 200, 300, 400, 500, 600, 700, 800, 900, 1,000, 2,000, 3,000, 4,000, 5,000, 6,000, 7,000, 8,000, 9,000, 10,000, or more dopant molecules 120, at most about 10,000, 9,000, 6,000, 5,000, 4,000, 3,000, 2,000, 1,000, 900, 800, 700, 600, 500, 400, 300, 200, 100, 90, 80, 70, 60, 50, 40, 30, 20, 10, 9, 8, 7, 6, 5, 4, 3, or 2 dopant molecules 120, or a number of dopant molecules 120 that is within a range defined by any two of the preceding values.

Such individual optical initialization may be particularly useful for qubits based on the dopant molecules 120. As described herein, such dopant molecules 120 may be separated from one another by distances that are relatively small compared with typical optical beam waists. For instance, in some embodiments, the dopant molecules 120 are separated from one another by distances of less than 10 nm (or any other separation distance described herein) in order to ensure suitable coupling between nearest neighbor dopant molecules 120. In some embodiments, a typical optical beam waist may be approximately 500 nm, such that optical energy will strike approximately 5,000 qubits. Thus, individual optical initialization may allow manipulation of individual qubits even when optical energy is directed to hundreds or thousands of qubits.

In some embodiments, individual optical initialization of qubits may allow individual initialization of qubits in the first qubit basis state or the second qubit basis state (or any linear combination thereof) to thereby initialize the non-classical computation.

RF or MW Manipulation of Individual Qubits

In some embodiments, the first and second qubit states described herein are separated by energy differences that are in the RF or MW portion of the electromagnetic spectrum. Thus, in some embodiments, manipulation of the quantum states of each qubit may be performed using RF or MW energy. Moreover, in some embodiments, the different physico-chemical environments of the different dopant molecules 120 gives rise to wavelength or frequency shifts that are not large enough to allow individual optical initialization of each qubit. In such embodiments, a plurality of qubits may first be simultaneously optically initialized using, for instance, a broadband optical source, as described herein. In some embodiments, the quantum state of each qubit is then individually manipulated using RF or MW energy.

In some embodiments, the first dopant molecule 120 may be configured to absorb first electromagnetic energy having a first central frequency and the second dopant molecule 120 may be configured to absorb second electromagnetic energy having a second central frequency. In some embodiments, the first or second central frequency is at least about 1 MHz, 2 MHz, 3 MHz, 4 MHz, 5 MHz, 6 MHz, 7 MHz, 8 MHz, 9 MHz, 10 MHz, 20 MHz, 30 MHz, 40 MHz, 50 MHz, 60 MHz, 70 MHz, 80 MHz, 90 MHz, 100 MHz, 200 MHz, 300 MHz, 400 MHz, 500 MHz, 600 MHz, 700 MHz, 800 MHz, 900 MHz, 1 gigahertz (GHz), 2 GHz, 3 GHz, 4 GHz, 5 GHz, 6 GHz, 7 GHz, 8 GHz, 9 GHz, 10 GHz, 20 GHz, 30 GHz, 40 GHz, 50 GHz, 60 GHz, 70 GHz, 80 GHz, 90 GHz, 100 GHz, or more, at most about 100 GHz, 90 GHz, 80 GHz, 70 GHz, 60 GHz, 50 GHz, 40 GHz, 30 GHz, 20 GHz, 10 GHz, 9 GHz, 8 GHz, 7 GHz, 6 GHz, 5 GHz, 4 GHz, 3 GHz, 2 GHz, 1 GHz, 900 MHz, 800 MHz, 700 MHz, 600 MHz, 500 MHz, 400 MHz, 300 MHz, 200 MHz, 100 MHz, 90 MHz, 80 MHz, 70 MHz, 60 MHz, 50 MHz, 40 MHz, 30 MHz, 20 MHz, 10 MHz, 9 MHz, 8 MHz, 7 MHz, 6 MHz, 5 MHz, 4 MHz, 3 MHz, 2 MHz, 1 MHz, or less, or within a range defined by any two of the preceding values. In some embodiments, the first or second central frequency is in an RF or MW portion of the electromagnetic spectrum.

In some embodiments, the first and second central frequencies are different from one another. In some embodiments, the first central frequency is associated with a first range of frequencies having a first bandwidth. In some embodiments, the first bandwidth is measured as a first FWHM bandwidth. In some embodiments, the second central frequency is associated with a second range of frequencies having a second bandwidth. In some embodiments, the second bandwidth is measured as a second FWHM bandwidth. In some embodiments, the first or second bandwidth is dependent on a power of RF or MW energy supplied to the first or second dopant molecule 120. In some embodiments, the first or second bandwidth comprises a natural bandwidth of the first or second dopant molecule 120. For instance, in some embodiments, the first or second bandwidth is at least about 100 Hz, 200 Hz, 300 Hz, 400 Hz, 500 Hz, 600 Hz, 700 Hz, 800 Hz, 900 Hz, 1 kHz, 2 kHz, 3 kHz, 4 kHz, 5 kHz, 6 kHz, 7 kHz, 8 kHz, 9 kHz, 10 kHz, 20 kHz, 30 kHz, 40 kHz, 50 kHz, 60 kHz, 70 kHz, 80 kHz, 90 kHz, 100 kHz, 200 kHz, 300 kHz, 400 kHz, 500 kHz, 600 kHz, 700 kHz, 800 kHz, 900 kHz, 1 MHz, 2 MHz, 3 MHz, 4 MHz, 5 MHz, 6 MHz, 7 MHz, 8 MHz, 9 MHz, 10 MHz, 20 MHz, 30 MHz, 40 MHz, 50 MHz, 60 MHz, 70 MHz, 80 MHz, 90 MHz, 100 MHz, or more, at most about 100 MHz, 90 MHz, 80 MHz, 70 MHz, 60 MHz, 50 MHz, 40 MHz, 30 MHz, 20 MHz, 10 MHz, 9 MHz, 8 MHz, 7 MHz, 6 MHz, 5 MHz, 4 MHz, 3 MHz, 2 MHz, 1 MHz, 900 kHz, 800 kHz, 700 kHz, 600 kHz, 500 kHz, 400 kHz, 300 kHz, 200 kHz, 100 kHz, 90 kHz, 80 kHz, 70 kHz, 60 kHz, 50 kHz, 40 kHz, 30 kHz, 20 kHz, 10 kHz, 9 kHz, 8 kHz, 7 kHz, 6 kHz, 5 kHz, 4 kHz, 3 kHz, 2 kHz, 1 kHz, 900 Hz, 800 Hz, 700 Hz, 600 Hz, 500 Hz, 400 Hz, 300 Hz, 200 Hz, 100 Hz, or less, or within a range defined by any two of the preceding values.

In some embodiments, the first range of frequencies and the second range of frequencies are different. In some embodiments, the first range of frequencies and the second range of frequencies do not overlap (e.g., within the first FWHM and the second FWHM). In some embodiments, the first FWHM and the second FWHM are similar to or narrower than the bandwidth of RF or MW energy directed to the first dopant molecule 120 and the second dopant molecule 120. In some embodiments, the non-overlapping nature of the first and second ranges of frequencies permits the first dopant molecule 120 to absorb RF or MW energy while the second dopant molecule 120 does not absorb the RF or MW energy. In some embodiments, the non-overlapping nature of the first and second ranges of frequencies permits the second dopant molecule 120 to absorb RF or MW energy while the first dopant molecule 120 does not absorb the RF or MW energy. This procedure may be referred to as "individual RF or MW manipulation" of the first and second dopant molecules 120.

Although discussed in terms of two dopant molecules 120, the principles of individual RF or MW manipulation described herein may be extended to any number of dopant molecules 120. For instance, individual RF or MW manipulation may be applied to at least about 2, 3, 4, 5, 6, 7, 8, 9, 10, 20, 30, 40, 50, 60, 70, 80, 90, 100, 200, 300, 400, 500, 600, 700, 800, 900, 1,000, 2,000, 3,000, 4,000, 5,000, 6,000, 7,000, 8,000, 9,000, 10,000, or more dopant molecules 120, at most about 10,000, 9,000, 8,000, 7,000, 6,000, 5,000, 4,000, 3,000, 2,000, 1,000, 900, 800, 700, 600, 500, 400, 300, 200, 100, 90, 80, 70, 60, 50, 40, 30, 20, 10, 9, 8, 7, 6, 5, 4, 3, or 2 dopant molecules 120, or a number of dopant molecules 120 that is within a range defined by any two of the preceding values.

Such individual RF or MW manipulation may be particularly useful for qubits based on the dopant molecules 120. As described herein, such dopant molecules 120 may be separated from one another by distances that are relatively small compared with typical optical beam waists. For instance, in some embodiments, the dopant molecules 120 are separated from one another by distances of less than 10 nm (or any other separation distance described herein) in order to ensure suitable coupling between nearest neighbor dopant molecules 120. In some embodiments, a typical optical beam waist may strike hundreds or thousands of qubits, as described herein.

Thus, individual RF or MW manipulation may allow individual coherent manipulation of the quantum states of each qubit following (individual or simultaneous) optical initialization of the qubits. In some embodiments, the coherent manipulation comprises implementation of at least one non-classical operation. In some embodiments, the non-classical operation comprises any non-classical operation described herein.

Storage of Non-Classical Information in Nuclear Spin Degrees of Freedom

In some embodiments, non-classical information (such as that obtained during or after implementation of any of the non-classical operations described herein) may be transferred from the electronic state of the at least one dopant molecule 120 to a nuclear spin state of the at least one dopant molecule 120 or at least one nearby molecule contained within the host material 110 (referred to as a "nearby host molecule"). In some embodiments, the information may be transferred by implementing a swap gate between the electronic state of the at least one dopant molecule 120 and the nuclear spin state. In some embodiments, the swap gate may be implemented by applying RF or MW energy to the at least one dopant molecule 120 and the nuclear spin state, as described herein.

In some embodiments, transferring the non-classical information to the nuclear spin state provides an increase in readout fidelity, initialization fidelity, or lifetime, thereby improving the overall fidelity of the non-classical computation.

In some embodiments, one or more of the dopant molecules 120 may be excited to a higher-level electronic triplet state (i.e., an electronic triplet state having a higher energy than any of the states shown in FIG. 2A or 2B) by application of electromagnetic energy. In some embodiments, the one or more dopant molecules 120 may then relax from the higher-level electronic triplet states at a relatively high ISC rate, allowing the electronic states of the one or more dopant molecules 120 to rapidly relax to a singlet state. For instance, an EST molecule described herein with respect to FIG. 2B may be optically pumped from the EST electronic manifold 270 to a higher-level electronic triplet state, then decay to the ground-state singlet electronic state 260. In some embodiments, such a "reverse ISC" (RISC) procedure permits the one or more dopant molecules to be selectively returned to a singlet state following the transfer of the non-classical information to the nuclear spin state. In some embodiments, the RISC procedure reduces magnetic noise associated with the electron spins of the PETS molecule, thereby increasing the lifetime of the PETS molecule. In some embodiments, the RISC procedure comprises a "triplet shelving" procedure (as described in A. A. Demissie et al, "Triplet Shelving in Fluorescein and its Derivatives Provides Delayed, Background-Free Fluorescence,"*J. Phys. Chem A* 124(7), 1437-1443 (2020), https://doi.org/10.1021/acs.jpca.9b11040, which is incorporated herein by reference in its entirety for all purposes).

Optical Readout of Individual Qubits

In some embodiments, the different electronic energy level structures of the dopant molecules 120 may allow individual optical readout of the quantum state of each dopant molecule 120 following the non-classical operation. For instance, the quantum state of each dopant molecule 120 may be individually optically read out based on the wavelength of light emitted by the dopant molecule 120, which may vary based on the physico-chemical environment of each dopant molecule 120.

In some embodiments, each dopant molecule 120 is configured to absorb and emit light. In some embodiments, an optical property of the light emitted by each dopant molecule 120 is correlated with the quantum state of the associated dopant molecule 120. For instance, in some embodiments, a dopant molecule 120 in the first qubit state absorbs and emits light having a first property, while a dopant molecule 120 in the second qubit state absorbs and emits light having a second property. In some embodiments, a dopant molecule in a linear superposition between the first qubit state and the second qubit state absorbs and emits light having a linear superposition of the first property and the second property. In some embodiments, the first property is different from the second property. Thus, in some embodiments, measuring the light emitted by the dopant molecule 120 allows determination of the quantum state of the dopant molecule 120 at the time of the measurement. In some embodiments, the first or second property comprises an intensity of the light emitted by the dopant molecule 120. In some embodiments, the first or second property comprises a polarization state of the light emitted by the dopant molecule 120. In some embodiments, the first or second property comprises a wavelength of the light emitted by the dopant molecule 120. In some embodiments, the first or second property comprises a frequency of the light emitted by the dopant molecule 120.

Figure 3:
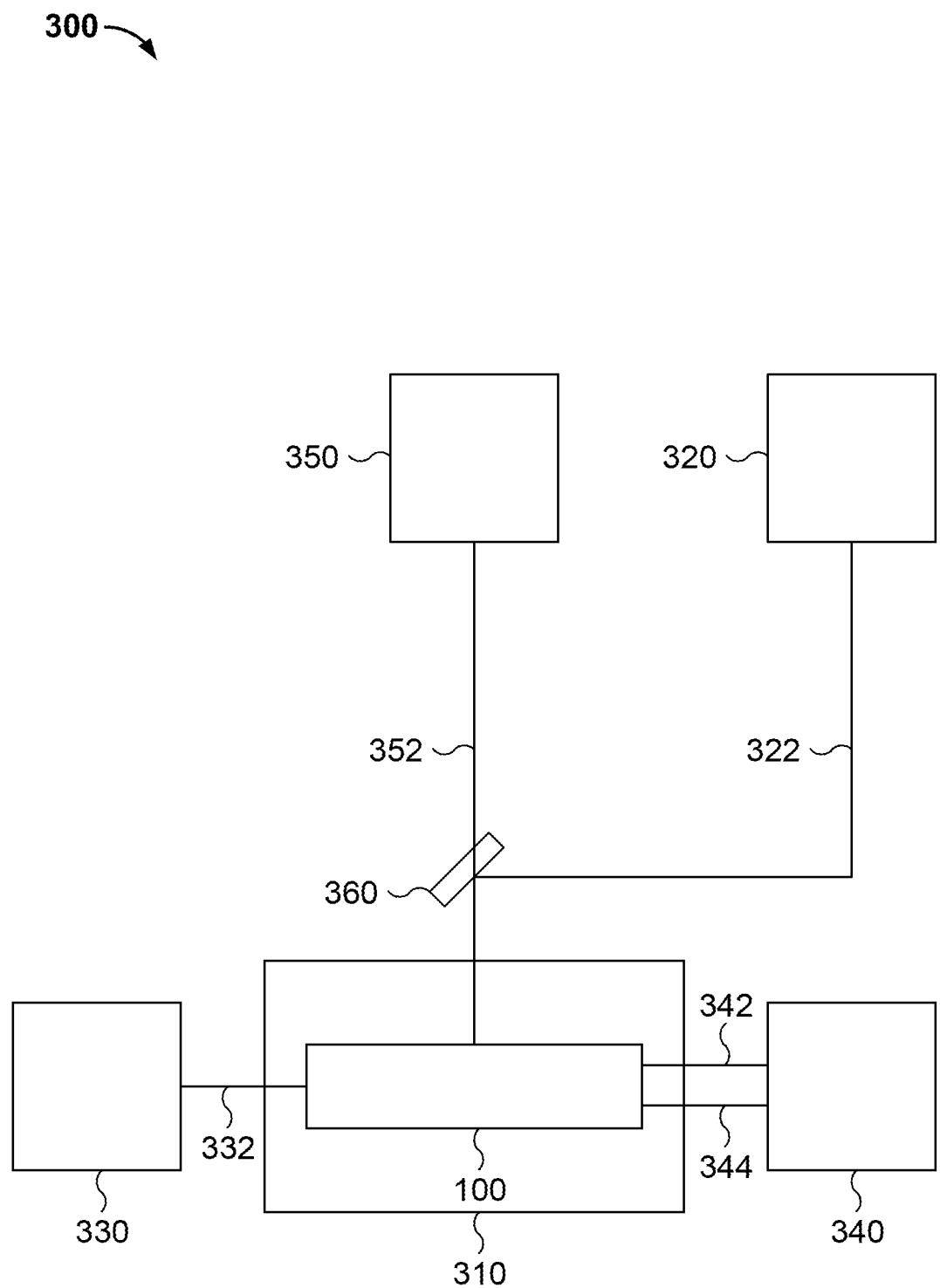
FIG. 3 shows a system for performing a non-classical computation using the system FIG. 1A or 1B, in accordance with various embodiments.

Systems for Initializing, Manipulating, and Reading Out Dopant Molecule Qubit States FIG. 3 shows a system 300 for performing a non-classical computation using the system 100 of FIG. 1A or 1B, in accordance with various embodiments. In the example shown, the system 300 comprises at least one cryogenic unit 310. In some embodiments, the cryogenic unit 310 is configured to contain the system 100 described herein with respect to FIGS. 1A and 1B. In some embodiments, the cryogenic unit 310 contains the system 100. In some embodiments, the cryogenic unit 310 does not contain the system 100. In some embodiments, the cryogenic unit 310 is configured to cool the system 100 to an operating temperature, such as a temperature of at least about 1 K, 2 K, 3 K, 4 K, 5 K, 6 K, 7 K, 8 K, 9 K, 10K, 15 K, 20 K, 25 K, 30 K, 35 K, 40 K, 45 K, 50 K, or more, at most about 50 K, 45 K, 40 K, 35 K, 30 K, 25 K, 20 K, 15 K, 10 K, 9 K, 8 K, 7 K, 6 K, 5 K, 4 K, 3 K, 2 K, 1 K, or less, or a temperature that is between any two of the preceding values (such as between about 4 K and about 20 K). In some embodiments, the cryogenic unit 310 comprises at least one helium cryocooler. In some embodiments, the cryogenic unit 310 comprises at least one closed-cycle helium cryocooler. In some embodiments, the cryogenic unit 310 comprises at least one window (not shown in FIG. 3) configured to permit electromagnetic energy (such as optical energy) to pass therethrough. In some embodiments, the cryogenic unit 310 comprises at least one electrical feedthrough (not shown in FIG. 3) configured to permit electromagnetic energy (such as RF or MW energy) to pass therethrough.

In the example shown, the system 300 comprises at least one initialization unit 320. In some embodiments, the initialization unit 320 is configured to direct third electromagnetic energy 322 to at least one dopant molecule (not shown in FIG. 3) of the system 100. In some embodiments, the third electromagnetic energy 322 is configured to initialize a quantum state of the at least one dopant molecule into any linear combination of the first qubit state and the second qubit state, as described herein with respect to FIGS. 1A, 1B, 2A, and 2B. In some embodiments, the third electromagnetic energy 322 comprises at least one IR, visible, or UV wavelength described herein. For instance, in some embodiments, the third electromagnetic energy 322 comprises at least one wavelength between about 200 nm and about 1,000 nm. In some embodiments, the initialization unit 320 is configured to initialize the quantum state of the at least one dopant molecule in any manner described herein with respect to FIG. 1A, 1B, 2A, or 2B. In some embodiments, the initialization unit 320 comprises a confocal optical system, a confocal microscope, or a widefield microscope. In some embodiments, the initialization unit 320 is configured to measure electromagnetic energy (not shown in FIG. 3) emitted by the at least one dopant molecule in response to the third electromagnetic energy 322. In some embodiments, the measured electromagnetic energy is indicative of whether the quantum state of the at least one dopant molecule was properly initialized. In some embodiments, measuring the emitted electromagnetic energy collapses the quantum state of the at least one dopant molecule into an electronic energy eigenstate of the at least one dopant molecule, thereby initializing the dopant molecule into a desired initial quantum state. In some embodiments, the initialization unit 320 is configured to re-apply the third electromagnetic energy 322 in response to the measured electromagnetic energy. For instance, in some embodiments, the initialization unit 320 is configured to re-apply the third electromagnetic energy 322 to the at least one dopant molecule if the measured electromagnetic energy indicates that the at least one dopant molecule was not properly initialized.

In the example shown, the system 300 comprises a single initialization unit 320. However, in some embodiments, the system 300 comprises a plurality of initialization units 320. In some embodiments, the system 300 comprises at least 1, 2, 3, 4, 5, 6, 7, 8, 9, 10, 20, 30, 40, 50, 60, 70, 80, 90, 100, 200, 300, 400, 500, 600, 700, 800, 900, 1,000, 2,000, 3,000, 4,000, 5,000, 6,000, 7,000, 8,000, 9,000, 10,000, 20,000, 30,000, 40,000, 50,000, 60,000, 70,000, 80,000, 90,000, 100,000, or more initialization units 320, at most about 100,000, 90,000, 80,000, 70,000, 60,000, 50,000, 40,000, 30,000, 20,000, 10,000, 9,000, 8,000, 7,000, 6,000, 5,000, 4,000, 3,000, 2,000, 1,000, 900, 800, 700, 600, 500, 400, 300, 200, 100, 90, 80, 70, 60, 50, 40, 30, 20, 10, 9, 8, 7, 6, 5, 4, 3, 2, or 1 initialization units 320, or a number of initialization units 320 that is within a range defined by any two of the preceding values. In some embodiments, each initialization unit 320 is configured to initialize a quantum state of at least about 1, 2, 3, 4, 5, 6, 7, 8, 9, 10, 20, 30, 40, 50, 60, 70, 80, 90, 100, 200, 300, 400, 500, 600, 700, 800, 900, 1,000, 2,000, 3,000, 4,000, 5,000, 6,000, 7,000, 8,000, 9,000, 10,000, or more qubits, at most about 10,000, 9,000, 8,000, 7,000, 6,000, 5,000, 4,000, 3,000, 2,000, 1,000, 900, 800, 700, 600, 500, 400, 300, 200, 100, 90, 80, 70, 60, 50, 40, 30, 20, 10, 9, 8, 7, 6, 5, 4, 3, 2, or 1 qubits, or a number of qubits that is within a range defined by any two of the preceding values.

In the example shown, the system 300 comprises at least one non-classical operation unit 330. In some embodiments, the non-classical operation unit 330 is configured to apply fourth electromagnetic energy 332 to at least one dopant molecule of the system 100. In some embodiments, the fourth electromagnetic energy 332 is configured to perform at least one non-classical operation on the at least one dopant molecule, as described herein with respect to FIGS. 1A, 1B, 2A, and 2B. In some embodiments, the fourth electromagnetic energy 332 comprises at least one RF or MW frequency described herein. For instance, in some embodiments, the fourth electromagnetic energy 332 comprises at least one frequency between about 1 MHz and about 100 GHz. In some embodiments, the non-classical operation unit is configured to perform any non-classical operation described in any manner described herein with respect to FIG. 1A, 1B, 2A, or 2B. In some embodiments, the non-classical operation unit 330 comprises at least one RF cavity, MW cavity, RF stripline, MW stripline, RF antenna, MW antenna, microscopic RF antenna, microscope MW antenna, nanoscopic RF antenna, or nanoscopic MW antenna.

In the example shown, the system 300 comprises a single non-classical operation unit 330. However, in some embodiments, the system 300 comprises a plurality of non-classical operation units 330. In some embodiments, the system 300 comprises at least 1, 2, 3, 4, 5, 6, 7, 8, 9, 10, 20, 30, 40, 50, 60, 70, 80, 90, 100, 200, 300, 400, 500, 600, 700, 800, 900, 1,000, or more non-classical operation units 330, at most about 1,000, 900, 800, 700, 600, 500, 400, 300, 200, 100, 90, 80, 70, 60, 50, 40, 30, 20, 10, 9, 8, 7, 6, 5, 4, 3, 2, or 1 non-classical operation units 330, or a number of non-classical operation units 330 that is within a range defined by any two of the preceding values. In some embodiments, each non-classical operation unit 330 is configured to perform a non-classical operation on at least about 1, 2, 3, 4, 5, 6, 7, 8, 9, 10, 20, 30, 40, 50, 60, 70, 80, 90, 100, 200, 300, 400, 500, 600, 700, 800, 900, 1,000, or more qubits, at most about 1,000, 900, 800, 700, 600, 500, 400, 300, 200, 100, 90, 80, 70, 60, 50, 40, 30, 20, 10, 9, 8, 7, 6, 5, 4, 3, 2, or 1 qubits, or a number of qubits that is within a range defined by any two of the preceding values.

In the example shown, the system 300 comprises at least one storage unit 340. In some embodiments, the at least one storage unit 340 is configured to apply fifth electromagnetic energy 342 and sixth electromagnetic energy 344 to the at least one dopant molecule. In some embodiments, the fifth electromagnetic energy 342 and sixth electromagnetic energy 344 are jointly configured to transfer information from the electronic state of the at least one dopant molecule to a nuclear spin state of the at least one dopant molecule, as described herein with respect to FIGS. 1A, 1B, 2A, and 2B. In some embodiments, the fifth electromagnetic energy 342 and sixth electromagnetic energy 344 are configured to jointly apply a swap gate to the at least one dopant molecule, as described herein with respect to FIGS. 1A, 1B, 2A, and 2B. In some embodiments, the fifth electromagnetic energy 342 comprises at least one RF or MW frequency described herein. For instance, in some embodiments, the fifth electromagnetic energy 342 comprises at least one frequency between about 1 kHz and about 100 MHz. In some embodiments, the sixth electromagnetic energy 344 comprises at least one RF or MW frequency described herein. For instance, in some embodiments, the sixth electromagnetic energy 344 comprises at least one frequency between about 1 MHz and about 100 GHz. In some embodiments, the storage unit 340 comprises at least one RF cavity, MW cavity, RF stripline, MW stripline, RF antenna, MW antenna, microscopic RF antenna, microscope MW antenna, nanoscopic RF antenna, or nanoscopic MW antenna.

In the example shown, the system 300 comprises a single storage unit 340. However, in some embodiments, the system 300 comprises a plurality of storage units 340. In some embodiments, the system 300 comprises at least 1, 2, 3, 4, 5, 6, 7, 8, 9, 10, 20, 30, 40, 50, 60, 70, 80, 90, 100, 200, 300, 400, 500, 600, 700, 800, 900, 1,000, or more storage units 340, at most about 1,000, 900, 800, 700, 600, 500, 400, 300, 200, 100, 90, 80, 70, 60, 50, 40, 30, 20, 10, 9, 8, 7, 6, 5, 4, 3, 2, or 1 storage units 340, or a number of storage units 340 that is within a range defined by any two of the preceding values. In some embodiments, each storage unit 340 is configured to transfer information from the electronic state to the nuclear spin state of at least about 1, 2, 3, 4, 5, 6, 7, 8, 9, 10, 20, 30, 40, 50, 60, 70, 80, 90, 100, 200, 300, 400, 500, 600, 700, 800, 900, 1,000, or more qubits, at most about 1,000, 900, 800, 700, 600, 500, 400, 300, 200, 100, 90, 80, 70, 60, 50, 40, 30, 20, 10, 9, 8, 7, 6, 5, 4, 3, 2, or 1 qubits, or a number of qubits that is within a range defined by any two of the preceding values.

In some embodiments, the system 300 does not comprise a storage unit 340.

In the example shown, the system 300 comprises at least one detection unit 350. In some embodiments, the detection unit 350 is configured to detect the electronic state of the at least one dopant molecule, as described herein with respect to FIGS. 1A, 1B, 2A, and 2B. In some embodiments, the detection unit 350 is configured to detect the nuclear spin state of the at least one dopant molecule, as described herein with respect to FIGS. 1A, 1B, 2A, and 2B. In some embodiments, the detection unit 350 is configured to direct seventh electromagnetic energy 352 to the at least one dopant molecule to thereby obtain a result of the at least one non-classical operation, as described herein with respect to FIGS. 1A, 1B, 2A, and 2B. In some embodiments, the seventh electromagnetic energy 352 comprises at least one IR, visible, or UV wavelength described herein. For instance, in some embodiments, the seventh electromagnetic energy 352 comprises at least one wavelength between about 200 nm and about 1,000 nm. In some embodiments, the detection unit 350 comprises at least one optical detector configured to detect light emitted by the at least one dopant molecule in response to the seventh electromagnetic energy 352. In some embodiments, the detection unit 350 comprises a confocal optical system, confocal microscope, widefield microscope, spectrometer, optical spectrometer, fluorescence spectrometer, UV-visible spectrometer, polarimeter, or polarization camera.

In the example shown, the system 300 comprises a single detection unit 350. However, in some embodiments, the system 300 comprises a plurality of detection units 350. In some embodiments, the system 300 comprises at least 1, 2, 3, 4, 5, 6, 7, 8, 9, 10, 20, 30, 40, 50, 60, 70, 80, 90, 100, 200, 300, 400, 500, 600, 700, 800, 900, 1,000, 2,000, 3,000, 4,000, 5,000, 6,000, 7,000, 8,000, 9,000, 10,000, 20,000, 30,000, 40,000, 50,000, 60,000, 70,000, 80,000, 90,000, 100,000, or more detection units 350, at most about 100,000, 90,000, 80,000, 70,000, 60,000, 50,000, 40,000, 30,000, 20,000, 10,000, 9,000, 8,000, 7,000, 6,000, 5,000, 4,000, 3,000, 2,000, 1,000, 900, 800, 700, 600, 500, 400, 300, 200, 100, 90, 80, 70, 60, 50, 40, 30, 20, 10, 9, 8, 7, 6, 5, 4, 3, 2, or 1 detection units 350, or a number of detection units 350 that is within a range defined by any two of the preceding values. In some embodiments, each detection unit 350 is configured to detect an electronic state or a nuclear spin state of at least about 1, 2, 3, 4, 5, 6, 7, 8, 9, 10, 20, 30, 40, 50, 60, 70, 80, 90, 100, 200, 300, 400, 500, 600, 700, 800, 900, 1,000, 2,000, 3,000, 4,000, 5,000, 6,000, 7,000, 8,000, 9,000, 10,000, or more qubits, at most about 10,000, 9,000, 8,000, 7,000, 6,000, 5,000, 4,000, 3,000, 2,000, 1,000, 900, 800, 700, 600, 500, 400, 300, 200, 100, 90, 80, 70, 60, 50, 40, 30, 20, 10, 9, 8, 7, 6, 5, 4, 3, 2, or 1 qubits, or a number of qubits that is within a range defined by any two of the preceding values.

In some embodiments, the system 300 comprises at least one polarizing beamsplitter 360. In some embodiments, the polarizing beamsplitter 360 is configured to direct the third electromagnetic energy 322 from the initialization unit 320 to the system 100. In some embodiments, the polarizing beamsplitter 360 is configured to direct the seventh electromagnetic energy 352 from the detection unit 350 to the system 100 and to direct the light emitted by the at least one dopant molecule in response to the seventh electromagnetic energy 352 from the system 100 to the detection unit 350.

In some embodiments, the system 300 comprises one or more magnetic field sources (not shown in FIG. 3). In some embodiments, the magnetic field sources are configured to generate one or more magnetic fields or magnetic field gradients in a vicinity of the system 100. In some embodiments, the magnetic field sources each comprise a permanent magnet, an electromagnet, or a superconducting magnet. In some embodiments, the magnetic field sources comprise one or more solenoids, Helmholtz coils, anti-Helmholtz coils, saddle coils, Halbach arrays, or the like. In some embodiments, one or more of the magnetic field sources are contained in the cryogenic unit 310. In some embodiments, one or more of the magnetic field sources is configured to generate an average magnetic field strength (over the system 100) of at least about 1 microtesla ($\mu$T), 2 $\mu$T, 3 $\mu$T, 4 $\mu$T, 5 $\mu$T, 6 $\mu$T, 7 $\mu$T, 8 $\mu$T, 9 $\mu$T, 10 $\mu$T, 20 $\mu$T, 30 $\mu$T, 40 $\mu$T, 50 $\mu$T, 60 $\mu$T, 70 $\mu$T, 80 $\mu$T, 90 $\mu$T, 100 $\mu$T, 200 $\mu$T, 300 $\mu$T, 400 $\mu$T, 500 $\mu$T, 600 $\mu$T, 700 $\mu$T, 800 $\mu$T, 900 $\mu$T, 1 millitesla (mT), 2 mT, 3 mT, 4 mT, 5 mT, 6 mT, 7 mT, 8 mT, 9 mT, 10 mT, 20 mT, 30 mT, 40 mT, 50 mT, 60 mT, 70 mT, 80 mT, 90 mT, 100 mT, 200 mT, 300 mT, 400 mT, 500 mT, 600 mT, 700 mT, 800 mT, 900 mT, 1 Tesla (T), or more, at most about 1 T, 900 mT, 800 mT, 700 mT, 600 mT, 500 mT, 400 mT, 300 mT, 200 mT, 100 mT, 90 mT, 80 mT, 70 mT, 60 mT, 50 mT, 40 mT, 30 mT, 20 mT, 10 mT, 9 mT, 8 mT, 7 mT, 6 mT, 5 mT, 4 mT, 3 mT, 2 mT, 1 mT, 900 $\mu$T, 800 $\mu$T, 700 $\mu$T, 600 $\mu$T, 500 $\mu$T, 400 $\mu$T, 300 $\mu$T, 200 $\mu$T, 100 $\mu$T, 90 $\mu$T, 80 $\mu$T, 70 $\mu$T, 60 $\mu$T, 50 $\mu$T, 40 $\mu$T, 30 $\mu$T, 20 $\mu$T, 10 $\mu$T, 9 $\mu$T, 8 $\mu$T, 7 $\mu$T, 6 $\mu$T, 5 $\mu$T, 4 $\mu$T, 3 $\mu$T, 2 $\mu$T, 1 $\mu$T, or less, or an average magnetic field strength that is within a range defined by any two of the preceding values. In some embodiments, one or more of the magnetic field sources is configured to an average magnetic field gradient (over the system 100) of at least about 1 microtesla per meter ($\mu$Tm$^{-1}$), 2 $\mu$Tm$^{-1}$, 3 $\mu$Tm$^{-1}$, 4 $\mu$Tm$^{-1}$, 5 $\mu$Tm$^{-1}$, 6 $\mu$Tm$^{-1}$, 7 $\mu$Tm$^{-1}$, 8 $\mu$Tm$^{-1}$, 9 $\mu$Tm$^{-1}$, 10 $\mu$Tm$^{-1}$, 20 $\mu$Tm$^{-1}$, 30 $\mu$Tm$^{-1}$, 40 $\mu$Tm$^{-1}$, 50 $\mu$Tm$^{-1}$, 60 $\mu$Tm$^{-1}$, 70 $\mu$Tm$^{-1}$, 80 $\mu$Tm$^{-1}$, 90 $\mu$Tm$^{-1}$, 100 $\mu$Tm$^{-1}$, 200 $\mu$Tm$^{-1}$, 300 $\mu$Tm$^{-1}$, 400 $\mu$Tm$^{-1}$, 500 $\mu$Tm$^{-1}$, 600 $\mu$Tm$^{-1}$, 700 $\mu$Tm$^{-1}$, 800 $\mu$Tm$^{-1}$, 900 $\mu$Tm$^{-1}$, 1 microtesla per meter (mTm$^{-1}$), 2 mTm$^{-1}$, 3 mTm$^{-1}$, 4 mTm$^{-1}$, 5 mTm$^{-1}$, 6 mTm$^{-1}$, 7 mTm$^{-1}$, 8 mTm$^{-1}$, 9 mTm$^{-1}$, 10 mTm$^{-1}$, 20 mTm$^{-1}$, 30 mTm$^{-1}$, 40 mTm$^{-1}$, 50 mTm$^{-1}$, 60 mTm$^{-1}$, 70 mTm$^{-1}$, 80 mTm$^{-1}$, 90 mTm$^{-1}$, 100 mTm$^{-1}$, 200 mTm$^{-1}$, 300 mTm$^{-1}$, 400 mTm$^{-1}$, 500 mTm$^{-1}$, 600 mTm$^{-1}$, 700 mTm$^{-1}$, 800 mTm$^{-1}$, 900 mTm$^{-1}$, 1,000 mTm$^{-1}$, or more, at most about 1,000 mTm$^{-1}$, 900 mTm$^{-1}$, 800 mTm$^{-1}$, 700 mTm$^{-1}$, 600 mTm$^{-1}$, 500 mTm$^{-1}$, 400 mTm$^{-1}$, 300 mTm$^{-1}$, 200 mTm$^{-1}$, 100 mTm$^{-1}$, 90 mTm$^{-1}$, 80 mTm$^{-1}$, 70 mTm$^{-1}$, 60 mTm$^{-1}$, 50 mTm$^{-1}$, 40 mTm$^{-1}$, 30 mTm$^{-1}$, 20 mTm$^{-1}$, 10 mTm$^{-1}$, 9 mTm$^{-1}$, 8 mTm$^{-1}$, 7 mTm$^{-1}$, 6 mTm$^{-1}$, 5 mTm$^{-1}$, 4 mTm$^{-1}$, 3 mTm$^{-1}$, 2 mTm$^{-1}$, 1 mTm$^{-1}$, 900 $\mu$Tm$^{-1}$, 800 $\mu$Tm$^{-1}$, 700 $\mu$Tm$^{-1}$, 600 $\mu$Tm$^{-1}$, 500 $\mu$Tm$^{-1}$, 400 $\mu$Tm$^{-1}$, 300 $\mu$Tm$^{-1}$, 200 $\mu$Tm$^{-1}$, 100 $\mu$Tm$^{-1}$, 90 $\mu$Tm$^{-1}$, 80 $\mu$Tm$^{-1}$, 70 $\mu$Tm$^{-1}$, 60 $\mu$Tm$^{-1}$, 50 $\mu$Tm$^{-1}$, 40 $\mu$Tm$^{-1}$, 30 $\mu$Tm$^{-1}$, 20 $\mu$Tm$^{-1}$, 10 $\mu$Tm$^{-1}$, 9 $\mu$Tm$^{-1}$, 8 $\mu$Tm$^{-1}$, 7 $\mu$Tm$^{-1}$, 6 $\mu$Tm$^{-1}$, 5 $\mu$Tm$^{-1}$, 4 $\mu$Tm$^{-1}$, 3 $\mu$Tm$^{-1}$, 2 $\mu$Tm$^{-1}$, 1 $\mu$Tm$^{-1}$, or less, or an average magnetic field gradient that is within a range defined by any two of the preceding values.

Methods for Performing Non-Classical Computations

FIG. 4 shows a flowchart depicting a method 400 for performing a non-classical computation, in accordance with various embodiments. In some embodiments, the method 400 is performed using the system 100 of FIG. 1A or 1B or the system 300 of FIG. 3. At 410, a plurality of dopant molecules contained in at least one host material are obtained. In some embodiments, the plurality of dopant molecules comprise any dopant molecules described herein with respect to FIG. 1A, 1B, 2A, 2B, or 3. In some embodiments, the host material comprises any host material described herein with respect to FIG. 1A, 1B, 2A, 2B, or 3. In some embodiments, each dopant molecule is associated with an electronic energy level structure that includes a triplet electronic manifold, as described herein with respect to FIG. 2A or 2B. In some embodiments, the triplet electronic manifold comprises a first triplet state, a second triplet state, and a third triplet state, as described herein with respect to FIG. 2A or 2B.

At 420, each dopant molecule is configured as a qubit having at least a first qubit state and a second qubit state, as described herein with respect to FIG. 1A, 1B, 2A, 2B, or 3. In some embodiments, the first qubit state comprises a first linear combination of the first triplet state, the second triplet state, and the third triplet state, as described herein. In some embodiments, the second qubit state comprising a second linear combination of the first triplet state, the second triplet state, and the third triplet state, wherein the first qubit state is different from the second qubit state, as described herein. In some embodiments, the first qubit state or the second qubit state has any lifetime described herein with respect to FIG. 1A, 1B, 2A, 2B, or 3 at any temperature described herein with respect to FIG. 1A, 1B, 2A, 2B, or 3. In some embodiments, at least one dopant molecule is coupled to at least one other dopant molecule by an electronic dipolar coupling interaction having any dipolar coupling strength described herein with respect to FIG. 1A, 1B, 2A, 2B, or 3.

At 430, a non-classical computation is performed on the at least one dopant molecule. In some embodiments, performing the non-classical computation comprises directing third electromagnetic energy to at least one dopant molecule to thereby initialize a quantum state of the at least one dopant molecule into the first qubit state or the second qubit state, applying fourth electromagnetic energy to at least one dopant molecule to thereby perform at least one non-classical operation on the at least one dopant molecule, and detecting the electronic state of the at least one dopant molecule or the nuclear spin state of the at least one dopant molecule to thereby obtain a result of the at least one non-classical operation, as described herein with respect to FIG. 1A, 1B, 2A, 2B, or 3. In some embodiments, the third electromagnetic energy comprises any third electromagnetic energy described herein. In some embodiments, the fourth electromagnetic energy comprises any fourth electromagnetic energy described herein. In some embodiments, the at least one non-classical operation comprises any non-classical operation described herein.

In some embodiments, the performing the non-classical computation further comprises, prior to detecting the nuclear spin state of the at least one dopant molecule, applying fifth electromagnetic energy and sixth electromagnetic energy to the at least one dopant molecule, as described herein with respect to FIG. 1A, 1B, 2A, 2B, or 3. In some embodiments, the fifth electromagnetic energy and sixth electromagnetic energy are jointly configured to transfer information from the electronic state to a nuclear spin state of the at least one dopant molecule, as described herein with respect to FIG. 1A, 1B, 2A, 2B, or 3. In some embodiments, the fifth electromagnetic energy comprises any fifth electromagnetic energy described herein. In some embodiments, the sixth electromagnetic energy comprises any sixth electromagnetic energy described herein.

In some embodiments, detecting the electronic state of the at least one dopant molecule or the nuclear spin state of the at least one dopant molecule comprises applying seventh electromagnetic energy to the at least one dopant molecule to thereby obtain the result of the at least one non-classical operation, as described herein with respect to FIG. 1A, 1B, 2A, 2B, or 3. In some embodiments, the seventh electromagnetic energy comprises any seventh electromagnetic energy described herein. In some embodiments, detecting the electronic state of the at least one dopant molecule or the nuclear spin state of the at least one dopant molecule further comprises detecting light emitted by the at least one dopant molecule in response to the seventh electromagnetic energy, as described herein with respect to FIG. 1A, 1B, 2A, 2B, or 3.

Recitation of Embodiments

Non-limiting embodiments of the foregoing disclosed herein include:

Embodiment 1. A system for performing a non-classical computation, comprising:
- at least one host material comprising at least one organic molecule; and
- a plurality of dopant molecules contained in the at least one host material, wherein:
  - each dopant molecule comprises a qubit having at least a first qubit state and a second qubit state;
  - each dopant molecule is associated with an electronic energy level structure that includes a triplet electronic manifold;
  - the triplet electronic manifold comprises a first triplet state, a second triplet state, and a third triplet state;
  - the first qubit state comprises a first linear combination of the first triplet state, the second triplet state, and the third triplet state;
  - the second qubit state comprises a second linear combination of the first triplet state, the second triplet state, and the third triplet state;
  - the first qubit state is different from the second qubit state;
  - the first qubit state or the second qubit state has a lifetime of at least 25 milliseconds (ms) at a temperature between 4 Kelvin (K) and 20 K; and
  - at least one dopant molecule is coupled to at least one other dopant molecule by an electronic dipolar coupling interaction having a dipolar coupling strength of at least 1 kilohertz (kHz).

Embodiment 2. The system of Embodiment 1, wherein the host material comprises a crystalline host material, a single crystalline host material, a polycrystalline host material, a liquid crystalline host material, a powder host material, an amorphous host material, or a frozen solution host material.

Embodiment 3. The system of Embodiment 1 or 2, wherein the host material comprises a C4-C20 linear or branched alkane; an aromatic hydrocarbon; a polyaromatic hydrocarbon optionally substituted with a methylene, carbonyl, imine, or thiocarbonyl group; a diarylketone; naphthalene; anthracene; p-terphenyl; benzoic acid; fluorene; biphenyl; benzene; n-hexane; biphenylene; ortho-terphenylene; meta-terphenylene; para-terphenylene; or benzophenone.

Embodiment 4. The system of any one of Embodiments 1-3, wherein the host material comprises a thin film having a thickness of at most 20 nanometers (nm).

Embodiment 5. The system of any one of Embodiments 1-4, wherein each dopant molecule comprises an organic molecule, an organometallic molecule, or an inorganic complex molecule.

Embodiment 6. The system of any one of Embodiments 1-5, wherein each dopant molecule comprises an [n]acene molecule, wherein n is between 2 and 6; a xanthene dye; a thioxanthene dye; a donor-acceptor molecule; acridine; pentacene; pyrene; diazapentacene; benzophenone; or benzopyrazine.

Embodiment 7. The system of any one of Embodiments 1-6, wherein the plurality of dopant molecules are arranged in a pseudo-two-dimensional (pseudo-2D) layer.

Embodiment 8. The system of Embodiment 7, wherein the pseudo-2D layer comprises a self-assembled monolayer (SAM).

Embodiment 9. The system of any one of Embodiments 1-8, wherein the at least one dopant molecule is coupled to at most 4 other dopant molecules by the electronic dipolar coupling interaction having the dipolar coupling strength.

Embodiment 10. The system of any one of Embodiments 1-9, wherein an average distance between the dopant molecules is at most 10 nm.

Embodiment 11. The system of any one of Embodiments 1-10, wherein the plurality of dopant molecules are contained in the at least one host material at a concentration of at least $10^6$ dopant molecules per cubic micrometer ($\mu m^3$).

Embodiment 12. The system of any one of Embodiments 1-11, wherein:
- a first dopant molecule of the plurality of dopant molecules is configured to absorb first electromagnetic energy having a first central wavelength or a first central frequency;

a second dopant molecule of the plurality of dopant molecules is configured to absorb second electromagnetic energy having a second central wavelength or a second central frequency; and the first central wavelength or the first central frequency is different from the second central wavelength or the second central frequencies.

Embodiment 13. The system of Embodiment 12, wherein:

the first central wavelength or the first central frequency is associated with a first range of wavelengths or a first range of frequencies having a first full width at half maximum (FWHM) bandwidth;

the second central wavelength or the second central frequency is associated with a second range of wavelengths or a second range of frequencies having a second FWHM bandwidth; and the first range of wavelengths or the first range of frequencies within the first FWHM bandwidth and the second range of wavelengths or the second range of frequencies within the second FWHM bandwidth do not overlap.

Embodiment 14. The system of Embodiment 13, wherein the first FWHM bandwidth or the second FWHM bandwidth is at most 100 megahertz (MHz).

Embodiment 15. The system of any one of Embodiments 12-14, wherein the first central wavelength or the second central wavelength is between 200 nm and 1,000 nm.

Embodiment 16. The system of Embodiment 13, wherein the first FWHM bandwidth or the second FWHM bandwidth is at most 100 gigahertz (GHz).

Embodiment 17. The system of Embodiment 16, wherein the first central frequency or the second central frequency is between 1 MHz and 100 GHz.

Embodiment 18. The system of any one of Embodiments 1-17, wherein the triplet electronic manifold comprises a ground state triplet (GST) electronic manifold.

Embodiment 19. The system of any one of Embodiments 1-17, wherein the triplet electronic manifold comprises an excited state triplet electronic manifold.

Embodiment 20. The system of Embodiment 19, wherein the triplet electronic manifold comprises a photoexcited triplet state (PETS) triplet electronic manifold.

Embodiment 21. The system of any one of Embodiments 1-20, wherein the dipolar coupling strength is greater than an inverse of the lifetime.

Embodiment 22. The system of any one of Embodiments 1-21, further comprising at least one initialization unit configured to direct third electromagnetic energy to at least one dopant molecule to thereby initialize a quantum state of the at least one dopant molecule into the first qubit state or the second qubit state.

Embodiment 23. The system of Embodiment 22, wherein the third electromagnetic energy comprises at least one wavelength between 200 nm and 1,000 nm.

Embodiment 24. The system of any one of Embodiments 1-23, further comprising at least one non-classical operation unit configured to apply fourth electromagnetic energy to at least one dopant molecule to thereby perform at least one non-classical operation on the at least one dopant molecule.

Embodiment 25. The system of Embodiment 24, wherein the at least one non-classical operation comprises at least one quantum operation, at least one quantum computing operation, at least one quantum gate operation, at least one quantum simulation operation, or at least one quantum annealing operation.

Embodiment 26. The system of Embodiment 24 or 25, wherein the fourth electromagnetic energy comprises at least one frequency between 1 MHz and 100 GHz.

Embodiment 27. The system of any one of Embodiments 24-26, wherein, subsequent to performing the at least one non-classical operation, a result of the at least one non-classical operation is correlated with an electronic state of the at least one dopant molecule.

Embodiment 28. The system of Embodiment 27, further comprising at least one storage unit configured to apply fifth electromagnetic energy and sixth electromagnetic energy to the at least one dopant molecule, wherein the fifth electromagnetic energy and sixth electromagnetic energy are jointly configured to transfer information from the electronic state to a nuclear spin state of the at least one dopant molecule.

Embodiment 29. The system of Embodiment 28, wherein the fifth electromagnetic energy and the sixth electromagnetic energy are configured to jointly apply a swap gate to the at least one dopant molecule to thereby transfer the information from the electronic state to the nuclear spin state of the at least one dopant molecule.

Embodiment 30. The system of Embodiment 28 or 29, wherein the fifth electromagnetic energy comprises at least one frequency between 1 kHz and 100 MHz and wherein the sixth electromagnetic energy comprises at least one frequency between 1 MHz and 100 GHz.

Embodiment 31. The system of any one of Embodiments 1-30, further comprising at least one detection unit configured to detect the electronic state of the at least one dopant molecule or the nuclear spin state of the at least one dopant molecule to thereby obtain a result of the at least one non-classical operation.

Embodiment 32. The system of Embodiment 31, wherein the at least one detection unit is configured to apply seventh electromagnetic energy to the at least one dopant molecule to thereby obtain the result of the at least one non-classical operation.

Embodiment 33. The system of Embodiment 31 or 32, wherein the at least one detection unit comprises at least one optical detector configured to detect light emitted by the at least one dopant molecule in response to the seventh electromagnetic energy.

Embodiment 34. The system of Embodiment 33, wherein the light emitted by the at least one dopant molecule has a first optical property associated with the first qubit state and a second optical property associated with the second qubit state, and wherein the first optical property is different from the second optical property.

Embodiment 35. The system of Embodiment 34, wherein the first optical property or the second optical property comprises an intensity, polarization, wavelength, or frequency of the light.

Embodiment 36. The system of any one of Embodiments 1-35, further comprising a cryogenic unit configured to contain the at least one host material and to cool the at least one host material to a temperature of at most 20 K.

Embodiment 37. The system of Embodiment 36, wherein the cryogenic unit comprises a helium cryocooler or a closed-cycle helium cryocooler.

Embodiment 38. A system comprising:

a cryogenic unit configured to:

contain at least one host material comprising at least one organic molecule, the host molecule containing a plurality of dopant molecules contained therein, wherein:

each dopant molecule comprises a qubit having at least a first qubit state and a second qubit state;
each dopant molecule is associated with an electronic energy level structure that includes a triplet electronic manifold;
the triplet electronic manifold comprises a first triplet state, a second triplet state, and a third triplet state;
the first qubit state comprises a first linear combination of the first triplet state, the second triplet state, and the third triplet state;
the second qubit state comprises a second linear combination of the first triplet state, the second triplet state, and the third triplet state;
the first qubit state is different from the second qubit state;
the first qubit state or the second qubit state has a lifetime of at least 25 milliseconds (ms); and
at least one dopant molecule is coupled to at least one other dopant molecule by an electronic dipolar coupling interaction having a dipolar coupling strength of at least 1 kHz; and
cool the at least one host material to a temperature of at most 20 K;
at least one initialization unit configured to direct third electromagnetic energy to at least one dopant molecule to thereby initialize a quantum state of the at least one dopant molecule into the first qubit state or the second qubit state;
at least one non-classical operation unit configured to apply fourth electromagnetic energy to at least one dopant molecule to thereby perform at least one non-classical operation on the at least one dopant molecule; and
at least one detection unit configured to detect the electronic state of the at least one dopant molecule or the nuclear spin state of the at least one dopant molecule to thereby obtain a result of the at least one non-classical operation.

Embodiment 39. The system of Embodiment 38, wherein the cryogenic unit comprises a helium cryocooler or a closed-cycle helium cryocooler.

Embodiment 40. The system of Embodiments 38 or 39, wherein the third electromagnetic energy comprises at least one wavelength between 200 nm and 1,000 nm.

Embodiment 41. The system of any one of Embodiments 38-40, wherein the at least one non-classical operation comprises at least one quantum operation, at least one quantum computing operation, at least one quantum gate operation, at least one quantum simulation operation, or at least one quantum annealing operation Embodiment 42. The system of any one of Embodiments 38-41, wherein the fourth electromagnetic energy comprises at least one frequency between 1 MHz and 100 GHz.

Embodiment 43. The system of any one of Embodiments 38-42, wherein, subsequent to performing the at least one non-classical operation, a result of the at least one non-classical operation is correlated with an electronic state of the at least one dopant molecule.

Embodiment 44. The system of any one of Embodiments 38-43, further comprising at least one storage unit configured to apply fifth electromagnetic energy and sixth electromagnetic energy to the at least one dopant molecule, wherein the fifth electromagnetic energy and sixth electromagnetic energy are jointly configured to transfer information from the electronic state to a nuclear spin state of the at least one dopant molecule.

Embodiment 45. The system of Embodiment 44, wherein the fifth electromagnetic energy and the sixth electromagnetic energy are configured to jointly apply a swap gate to the at least one dopant molecule to thereby transfer the information from the electronic state to the nuclear spin state of the at least one dopant molecule.

Embodiment 46. The system of Embodiment 44 or 45, wherein the fifth electromagnetic energy comprises at least one frequency between 1 kHz and 100 MHz and wherein the sixth electromagnetic energy comprises at least one frequency between 1 MHz and 100 GHz.

Embodiment 47. The system of any one of Embodiments 38-46, wherein the at least one detection unit is configured to apply seventh electromagnetic energy to the at least one dopant molecule to thereby obtain the result of the at least one non-classical operation.

Embodiment 48. The system of any one of Embodiments 38-47, wherein the at least one detection unit comprises at least one optical detector configured to detect light emitted by the at least one dopant molecule in response to the seventh electromagnetic energy.

Embodiment 49. The system of Embodiment 48, wherein the light emitted by the at least one dopant molecule has a first optical property associated with the first qubit state and a second optical property associated with the second qubit state, and wherein the first optical property is different from the second optical property.

Embodiment 50. The system of Embodiment 49, wherein the first optical property or the second optical property comprises an intensity, polarization, wavelength, or frequency of the light.

Embodiment 51. The system of any one of Embodiments 38-50, wherein the host material comprises a crystalline host material, a single crystalline host material, a polycrystalline host material, a liquid crystalline host material, a powder host material, an amorphous host material, or a frozen solution host material.

Embodiment 52. The system of any one of Embodiments 38-51, wherein the host material comprises a C4-C20 linear or branched alkane; an aromatic hydrocarbon; a polyaromatic hydrocarbon optionally substituted with a methylene, carbonyl, imine, or thiocarbonyl group; a diarylketone; naphthalene; anthracene; p-terphenyl; benzoic acid; fluorene; biphenyl; benzene; n-hexane; biphenylene; ortho-terphenylene; meta-terphenylene; para-terphenylene; or benzophenone.

Embodiment 53. The system of any one of Embodiments 38-52, wherein the host material comprises a thin film having a thickness of at most 20 nanometers (nm).

Embodiment 54. The system of any one of Embodiments 38-53, wherein each dopant molecule comprises an organic molecule, an organometallic molecule, or an inorganic complex molecule.

Embodiment 55. The system of any one of Embodiments 38-54, wherein each dopant molecule comprises an [n]acene molecule, wherein n is between 2 and 6; a xanthene dye; a thioxanthene dye; a donor-acceptor molecule; acridine; pentacene; pyrene; diazapentacene; benzophenone; or benzopyrazine.

Embodiment 56. The system of any one of Embodiments 38-54, wherein the plurality of dopant molecules are arranged in a pseudo-two-dimensional (pseudo-2D) layer.

Embodiment 57. The system of Embodiment 56, wherein the pseudo-2D layer comprises a self-assembled monolayer (SAM).

Embodiment 58. The system of any one of Embodiments 38-57, wherein the at least one dopant molecule is coupled to at most 4 other dopant molecules by the electronic dipolar coupling interaction having the dipolar coupling strength.

Embodiment 59. The system of any one of Embodiments 38-58, wherein an average distance between the dopant molecules is at most 10 nm.

Embodiment 60. The system of any one of Embodiments 38-59, wherein the plurality of dopant molecules are contained in the at least one host material at a concentration of at least $10^6$ dopant molecules per cubic micrometer ($\mu m^3$).

Embodiment 61. The system of any one of Embodiments 38-60, wherein the triplet electronic manifold comprises a ground state triplet (GST) electronic manifold.

Embodiment 62. The system of any one of Embodiments 38-60, wherein the triplet electronic manifold comprises an excited state triplet electronic manifold.

Embodiment 63. The system of Embodiment 62, wherein the triplet electronic manifold comprises a photoexcited triplet state (PETS) triplet electronic manifold.

Embodiment 64. The system of any one of Embodiments 38-63, wherein the dipolar coupling strength is greater than an inverse of the lifetime.

Embodiment 65. A method for performing a non-classical computation, comprising:
  obtaining a plurality of dopant molecules contained in at least one host material, wherein each dopant molecule is associated with an electronic energy level structure that includes a triplet electronic manifold, wherein the triplet electronic manifold comprises a first triplet state, a second triplet state, and a third triplet state;
  configuring each dopant molecule as a qubit having at least a first qubit state and a second qubit state, wherein the first qubit state comprises a first linear combination of the first triplet state, the second triplet state, and the third triplet state, wherein the second qubit state comprising a second linear combination of the first triplet state, the second triplet state, and the third triplet state, wherein the first qubit state is different from the second qubit state, wherein the first qubit state or the second qubit state has a lifetime of at least 25 milliseconds (ms) at a temperature between 4 Kelvin (K) and 20 K, and wherein at least one dopant molecule is coupled to at least one other dopant molecule by an electronic dipolar coupling interaction having a dipolar coupling strength of at least 1 kilohertz (kHz); and
  performing the non-classical computation on the at least one dopant molecule.

Embodiment 66. The method of Embodiment 65, wherein the performing the non-classical computation on the at least one dopant molecule comprises:
  directing third electromagnetic energy to at least one dopant molecule to thereby initialize a quantum state of the at least one dopant molecule into the first qubit state or the second qubit state;
  applying fourth electromagnetic energy to at least one dopant molecule to thereby perform at least one non-classical operation on the at least one dopant molecule; and
  detecting the electronic state of the at least one dopant molecule or the nuclear spin state of the at least one dopant molecule to thereby obtain a result of the at least one non-classical operation.

Embodiment 67. The method of Embodiment 66, wherein the third electromagnetic energy comprises at least one wavelength between 200 nm and 1,000 nm.

Embodiment 68. The method of Embodiment 66 or 67, wherein the at least one non-classical operation comprises at least one quantum operation, at least one quantum computing operation, at least one quantum gate operation, at least one quantum simulation operation, or at least one quantum annealing operation.

Embodiment 69. The method of any one of Embodiments 66-68, wherein the fourth electromagnetic energy comprises at least one frequency between 1 MHz and 100 GHz.

Embodiment 70. The method of any one of Embodiments 66-69, further comprising, prior to detecting the nuclear spin state of the at least one dopant molecule, applying fifth electromagnetic energy and sixth electromagnetic energy to the at least one dopant molecule, wherein the fifth electromagnetic energy and sixth electromagnetic energy are jointly configured to transfer information from the electronic state to a nuclear spin state of the at least one dopant molecule.

Embodiment 71. The method of Embodiment 70, wherein the fifth electromagnetic energy and the sixth electromagnetic energy are configured to jointly apply a swap gate to the at least one dopant molecule to thereby transfer the information from the electronic state to the nuclear spin state of the at least one dopant molecule.

Embodiment 72. The method of Embodiment 70 or 71, wherein the fifth electromagnetic energy comprises at least one frequency between 1 kHz and 100 MHz and wherein the sixth electromagnetic energy comprises at least one frequency between 1 MHz and 100 GHz.

Embodiment 73. The method of any one of Embodiments 66-72, wherein the detecting the electronic state of the at least one dopant molecule or the nuclear spin state of the at least one dopant molecule comprises applying seventh electromagnetic energy to the at least one dopant molecule to thereby obtain the result of the at least one non-classical operation.

Embodiment 74. The method of Embodiment 73, wherein the detecting the electronic state of the at least one dopant molecule or the nuclear spin state of the at least one dopant molecule further comprises detecting light emitted by the at least one dopant molecule in response to the seventh electromagnetic energy.

Embodiment 75. The method of Embodiment 74, wherein the light emitted by the at least one dopant molecule has a first optical property associated with the first qubit state and a second optical property associated with the second qubit state, and wherein the first optical property is different from the second optical property.

Embodiment 76. The method of Embodiment 75, wherein the first optical property or the second optical property comprises an intensity, polarization, wavelength, or frequency of the light.

Embodiment 77. The method of any one of Embodiments 66-76, further comprising cooling the at least one host material to a temperature of at most 20 K.

Embodiment 78. The method of any one of Embodiments 65-77, wherein the host material comprises a crystalline host material, a single crystalline host material, a polycrystalline host material, a liquid crystalline host material, a powder host material, an amorphous host material, or a frozen solution host material.

Embodiment 79. The method of any one of Embodiments 65-78, wherein the host material comprises a C4-C20 linear or branched alkane; an aromatic hydrocarbon; a polyaromatic hydrocarbon optionally substituted with a methylene, carbonyl, imine, or thiocarbonyl group; a diarylketone; naphthalene; anthracene; p-terphenyl; benzoic acid; fluorene; biphenyl; benzene; n-hexane; biphenylene; ortho-terphenylene; meta-terphenylene; para-terphenylene; or benzophenone.

Embodiment 80. The method of any one of Embodiments 65-79, wherein the host material comprises a thin film having a thickness of at most 20 nanometers (nm).

Embodiment 81. The method of any one of Embodiments 65-80, wherein each dopant molecule comprises an organic molecule, an organometallic molecule, or an inorganic complex molecule.

Embodiment 82. The method of any one of Embodiments 65-81, wherein each dopant molecule comprises an [n]acene molecule, wherein n is between 2 and 6; a xanthene dye; a thioxanthene dye; a donor-acceptor molecule; acridine; pentacene; pyrene; diazapentacene; benzophenone; or benzopyrazine.

Embodiment 83. The method of any one of Embodiments 65-82, wherein the plurality of dopant molecules are arranged in a pseudo-two-dimensional (pseudo-2D) layer.

Embodiment 84. The method of Embodiment 83, wherein the pseudo-2D layer comprises a self-assembled monolayer (SAM).

Embodiment 85. The method of any one of Embodiments 65-84, wherein the at least one dopant molecule is coupled to at most 4 other dopant molecules by the electronic dipolar coupling interaction having the dipolar coupling strength.

Embodiment 86. The method of any one of Embodiments 65-85, wherein an average distance between the dopant molecules is at most 10 nm.

Embodiment 87. The method of any one of Embodiments 65-86, wherein the plurality of dopant molecules are contained in the at least one host material at a concentration of at least $10^6$ dopant molecules per cubic micrometer ($\mu m^3$).

Embodiment 88. The method of any one of Embodiments 65-87, wherein the triplet electronic manifold comprises a ground state triplet (GST) electronic manifold.

Embodiment 89. The method of any one of Embodiments 65-88, wherein the triplet electronic manifold comprises an excited state triplet electronic manifold.

Embodiment 90. The method of Embodiment 89, wherein the triplet electronic manifold comprises a photoexcited triplet state (PETS) triplet electronic manifold.

Embodiment 91. The method of any one of Embodiments 65-90, wherein the dipolar coupling strength is greater than an inverse of the lifetime.

EXAMPLES

Example 1— Production of Pentacene:Naphthalene Crystals

More than 50 grams (g) of 99% purity naphthalene were purchased from Sigma-Aldrich and further purified by sublimation. Pentacene-d14 (pentacene with deuterium at all 14 hydrogen sites) was purchased from Sigma-Aldrich and used without further purification. In order to grow a pentacene doped naphthalene single crystal, the self-seeding vertical Bridgman technique was used. A double walled ampule was used, where the inner wall had an open capillary towards the interspace between the walls. The ampule filled with naphthalene and pentacene was then moved through a steep temperature gradient, which included the melting temperature of naphthalene. This temperature gradient was achieved by a bath with two liquid phases, which were heated to different temperatures. When the ampule was lowered into the upper and warmer part of the bath, the pentacene-naphthalene mixture melted into a homogeneous liquid. Once the bottom of the ampule reached the phase separation in the heating bath, crystallization started in the interspace between the ampule walls. Here, the solidification happened with multiple nuclei, leading to a polycrystalline area in the interspace between the walls. By moving the ampule slowly within that region, the number of nucleation events could be kept minimal, leading to a polycrystal with relatively large grains. Once the ampule was lowered further, the capillary of the inner wall contacted the polycrystal. Ideally, the crystal orientation of only one single grain formed within the capillary. Such a self-seeding process favored the emergence of a single crystal within the inner wall of the ampule.

The foregoing description has been presented for purposes of illustration. It is not exhaustive and is not limited to precise forms or embodiments disclosed. Modifications and adaptations of the embodiments will be apparent from consideration of the specification and practice of the disclosed embodiments. For example, the described implementations include hardware, but systems and methods consistent with the present disclosure can be implemented with hardware and software. In addition, while certain components have been described as being coupled to one another, such components may be integrated with one another or distributed in any suitable fashion.

Moreover, while illustrative embodiments have been described herein, the scope includes any and all embodiments having equivalent elements, modifications, omissions, combinations (e.g., of aspects across various embodiments), adaptations or alterations based on the present disclosure. The elements in the claims are to be interpreted broadly based on the language employed in the claims and not limited to examples described in the present specification or during the prosecution of the application, which examples are to be construed as nonexclusive. Further, the steps of the disclosed methods can be modified in any manner, including reordering steps or inserting or deleting steps.

The features and advantages of the disclosure are apparent from the detailed specification, and thus, it is intended that the appended claims cover all systems and methods falling within the true spirit and scope of the disclosure. As used herein, the indefinite articles "a" and "an" mean "one or more." Similarly, the use of a plural term does not necessarily denote a plurality unless it is unambiguous in the given context. Further, since numerous modifications and variations will readily occur from studying the present disclosure, it is not desired to limit the disclosure to the exact construction and operation illustrated and described, and accordingly, all suitable modifications and equivalents may be resorted to, falling within the scope of the disclosure.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Other embodiments will be apparent from consideration of the specification and practice of the embodiments disclosed herein. It is intended that the specification and examples be considered as an example only, with a true scope and spirit of the disclosed embodiments being indicated by the following claims.

What is claimed is:

1. A system for performing a non-classical computation, comprising:
    at least one host material comprising at least one organic molecule; and
    a plurality of dopant molecules contained in the at least one host material, wherein:
        each dopant molecule comprises a qubit having at least a first qubit state and a second qubit state;
        each dopant molecule is associated with an electronic energy level structure that includes a triplet electronic manifold;
        the triplet electronic manifold comprises a first triplet state, a second triplet state, and a third triplet state;
        the first qubit state comprises a first linear combination of the first triplet state, the second triplet state, and the third triplet state;
        the second qubit state comprises a second linear combination of the first triplet state, the second triplet state, and the third triplet state;
        the first qubit state is different from the second qubit state;
        the first qubit state or the second qubit state has a lifetime of at least 25 milliseconds (ms) at a temperature between 4 Kelvin (K) and 20 K; and
        at least one dopant molecule is coupled to at least one other dopant molecule by an electronic dipolar coupling interaction having a dipolar coupling strength of at least 1 kilohertz (kHz).

2. The system of claim 1, wherein the host material comprises a crystalline host material, a single crystalline host material, a polycrystalline host material, a liquid crystalline host material, a powder host material, an amorphous host material, or a frozen solution host material.

3. The system of claim 1, wherein the host material comprises a C4-C20 linear or branched alkane; an aromatic hydrocarbon; a polyaromatic hydrocarbon optionally substituted with a methylene, carbonyl, imine, or thiocarbonyl group; a diarylketone; naphthalene; anthracene; p-terphenyl; benzoic acid; fluorene; biphenyl; benzene; n-hexane; biphenylene; ortho-terphenylene; meta-terphenylene; para-terphenylene; or benzophenone.

4. The system of claim 1, wherein the host material comprises a thin film having a thickness of at most 20 nanometers (nm).

5. The system of claim 1, wherein each dopant molecule comprises an organic molecule, an organometallic molecule, or an inorganic complex molecule.

6. The system of claim 1, wherein each dopant molecule comprises a an [n]acene molecule, wherein n is between 2 and 6; a xanthene dye; a thioxanthene dye; a donor-acceptor molecule; acridine; pentacene; pyrene; diazapentacene; benzophenone; or benzopyrazine.

7. The system of claim 1, wherein the plurality of dopant molecules are arranged in a pseudo-two-dimensional (pseudo-2D) layer.

8. The system of claim 1, wherein the at least one dopant molecule is coupled to at most 4 other dopant molecules by the electronic dipolar coupling interaction having the dipolar coupling strength.

9. The system of claim 1, wherein an average distance between the dopant molecules is at most 10 nm.

10. The system of claim 1, wherein the plurality of dopant molecules are contained in the at least one host material at a concentration of at least $10^6$ dopant molecules per cubic micrometer ($\mu m^3$).

11. The system of claim 1, wherein:
    a first dopant molecule of the plurality of dopant molecules is configured to absorb first electromagnetic energy having a first central wavelength or a first central frequency;
    a second dopant molecule of the plurality of dopant molecules is configured to absorb second electromagnetic energy having a second central wavelength or a second central frequency; and
    the first central wavelength or the first central frequency is different from the second central wavelength or the second central frequencies.

12. The system of claim 11, wherein:
    the first central wavelength or the first central frequency is associated with a first range of wavelengths or a first range of frequencies having a first full width at half maximum (FWHM) bandwidth;
    the second central wavelength or the second central frequency is associated with a second range of wavelengths or a second range of frequencies having a second FWHM bandwidth; and
    the first range of wavelengths or the first range of frequencies within the first FWHM bandwidth and the second range of wavelengths or the second range of frequencies within the second FWHM bandwidth do not overlap.

13. The system of claim 12, wherein the first FWHM bandwidth or the second FWHM bandwidth is at most 100 megahertz (MHz) and wherein the first central wavelength or the second central wavelength is between 200 nm and 1,000 nm.

14. The system of claim 11, wherein the first FWHM bandwidth or the second FWHM bandwidth is at most 100 gigahertz (GHz) and wherein the first central frequency or the second central frequency is between 1 MHz and 100 GHz.

15. The system of claim 1, wherein the triplet electronic manifold comprises an excited state triplet electronic manifold.

16. The system of claim 15, wherein the triplet electronic manifold comprises a photoexcited triplet state (PETS) triplet electronic manifold.

17. The system of claim 1, wherein the dipolar coupling strength is greater than an inverse of the lifetime.

18. The system of claim 1, further comprising at least one initialization unit configured to direct third electromagnetic energy to at least one dopant molecule to thereby initialize a quantum state of the at least one dopant molecule into the first qubit state or the second qubit state.

19. The system of claim 18, wherein the third electromagnetic energy comprises at least one wavelength between 200 nm and 1,000 nm.

20. The system of claim 1, further comprising at least one non-classical operation unit configured to apply fourth electromagnetic energy to at least one dopant molecule to thereby perform at least one non-classical operation on the at least one dopant molecule, wherein the at least one non-classical operation comprises at least one quantum operation, at least one quantum computing operation, at least one quantum gate operation, at least one quantum simulation operation, or at least one quantum annealing operation.

21. The system of claim 20, wherein the fourth electromagnetic energy comprises at least one frequency between 1 MHz and 100 GHz.

22. The system of claim 20, wherein, subsequent to performing the at least one non-classical operation, a result of the at least one non-classical operation is correlated with an electronic state of the at least one dopant molecule.

23. The system of claim 22, further comprising at least one storage unit configured to apply fifth electromagnetic energy and sixth electromagnetic energy to the at least one dopant molecule, wherein the fifth electromagnetic energy and sixth electromagnetic energy are jointly configured to transfer information from the electronic state to a nuclear spin state of the at least one dopant molecule.

24. The system of claim 23, wherein the fifth electromagnetic energy and the sixth electromagnetic energy are configured to jointly apply a swap gate to the at least one dopant molecule to thereby transfer the information from the electronic state to the nuclear spin state of the at least one dopant molecule.

25. The system of claim 23, wherein the fifth electromagnetic energy comprises at least one frequency between 1 kHz and 100 MHz and wherein the sixth electromagnetic energy comprises at least one frequency between 1 MHz and 100 GHz.

26. The system of claim 1, further comprising at least one detection unit configured to detect the electronic state of the at least one dopant molecule or the nuclear spin state of the at least one dopant molecule to thereby obtain a result of the at least one non-classical operation.

27. The system of claim 26, wherein the at least one detection unit is configured to apply seventh electromagnetic energy to the at least one dopant molecule to thereby obtain the result of the at least one non-classical operation and to detect light emitted by the at least one dopant molecule in response to the seventh electromagnetic energy.

28. The system of claim 27, wherein the light emitted by the at least one dopant molecule has a first optical property associated with the first qubit state and a second optical property associated with the second qubit state, and wherein the first optical property is different from the second optical property.

29. The system of claim 28, wherein the first optical property or the second optical property comprises an intensity, polarization, wavelength, or frequency of the light.

30. The system of claim 1, further comprising a cryogenic unit configured to contain the at least one host material and to cool the at least one host material to a temperature of at most 20 K.

* * * * *